(12) United States Patent
Fulford et al.

(10) Patent No.: US 11,756,836 B2
(45) Date of Patent: Sep. 12, 2023

(54) 3D DEVICE LAYOUT AND METHOD USING ADVANCED 3D ISOLATION

(71) Applicant: Tokyo Electron Limited, Tokyo (JP)

(72) Inventors: H. Jim Fulford, Marianna, FL (US); Mark I. Gardner, Cedar Creek, TX (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 178 days.

(21) Appl. No.: 17/480,380

(22) Filed: Sep. 21, 2021

(65) Prior Publication Data

US 2022/0367289 A1 Nov. 17, 2022

Related U.S. Application Data

(60) Provisional application No. 63/188,033, filed on May 13, 2021.

(51) Int. Cl.
| | |
|---|---|
| *H01L 21/8234* | (2006.01) |
| *H01L 29/78* | (2006.01) |
| *H01L 29/417* | (2006.01) |
| *H01L 21/822* | (2006.01) |
| *H01L 29/66* | (2006.01) |
| *H01L 27/06* | (2006.01) |

(52) U.S. Cl.
CPC .. *H01L 21/823487* (2013.01); *H01L 21/8221* (2013.01); *H01L 21/823481* (2013.01); *H01L 27/0688* (2013.01); *H01L 29/66666* (2013.01); *H01L 29/7827* (2013.01); *H01L 29/41741* (2013.01)

(58) Field of Classification Search
CPC ..... H01L 21/823487; H01L 21/823475; H01L 21/823871; H01L 21/823885; H01L 29/41741; H01L 29/66666; H01L 29/7827
See application file for complete search history.

(56) References Cited

U.S. PATENT DOCUMENTS

2022/0344209 A1* 10/2022 Fulford ........... H01L 21/823885
2022/0359312 A1* 11/2022 Fulford ............... H01L 29/7827

* cited by examiner

*Primary Examiner* — Robert G Bachner
*Assistant Examiner* — Molly K Reida
(74) *Attorney, Agent, or Firm* — Oblon, McClelland, Maier & Neustadt, L.L.P.

(57) ABSTRACT

Aspects of the present disclosure provide a method for forming a semiconductor structure having separated vertical channel structures. The method can include forming a layer stack on a substrate, the layer stack including alternating metal layers and dielectric layers. The method can further include forming vertically stacked lower and upper vertical channel structures vertically extending through the layer stack, the lower and upper vertical channel structures being separated by a sacrificial layer. The method can further include forming source, drain and gate connections to the lower and upper vertical channel structures, the source, drain and gate connections extending horizontally from the lower and upper vertical channel structures and then vertically to a location above the upper vertical channel structure. The method can further include forming a vertical opening in the layer stack and removing the sacrificial layer through the vertical opening to separate the lower and upper vertical channel structures.

20 Claims, 22 Drawing Sheets

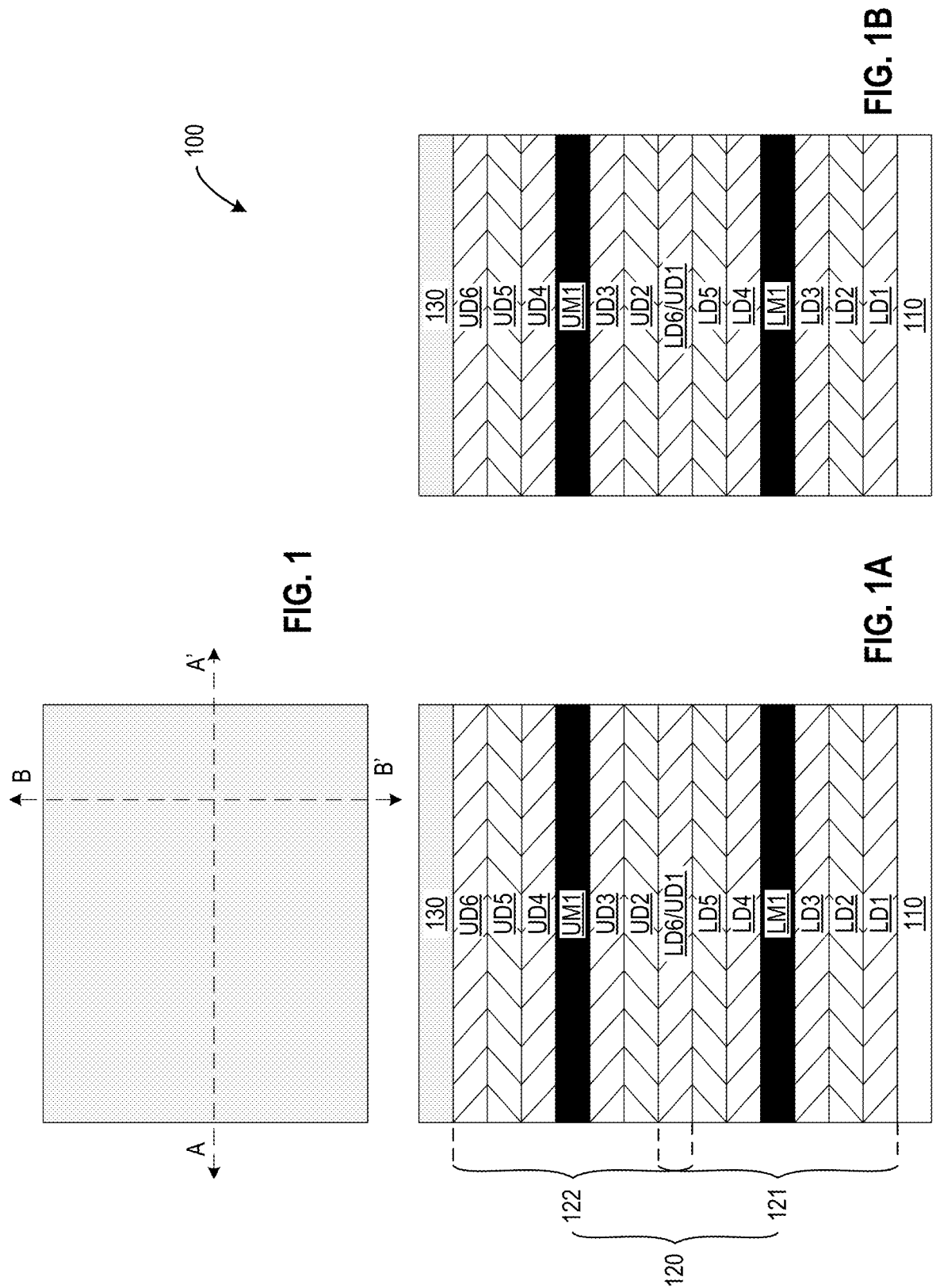

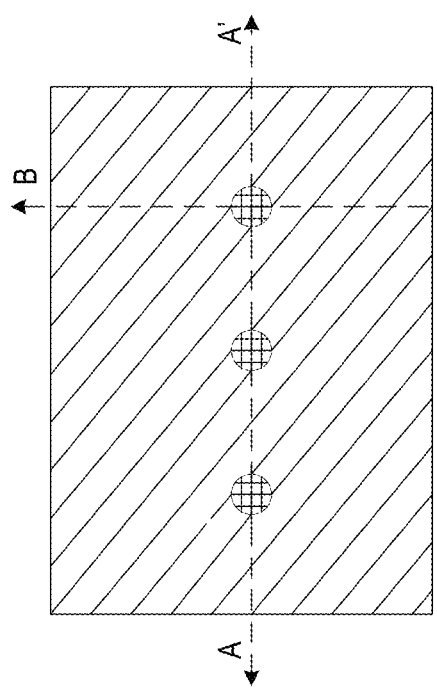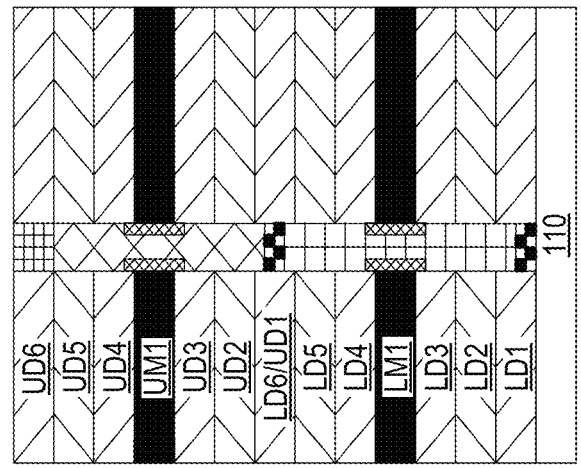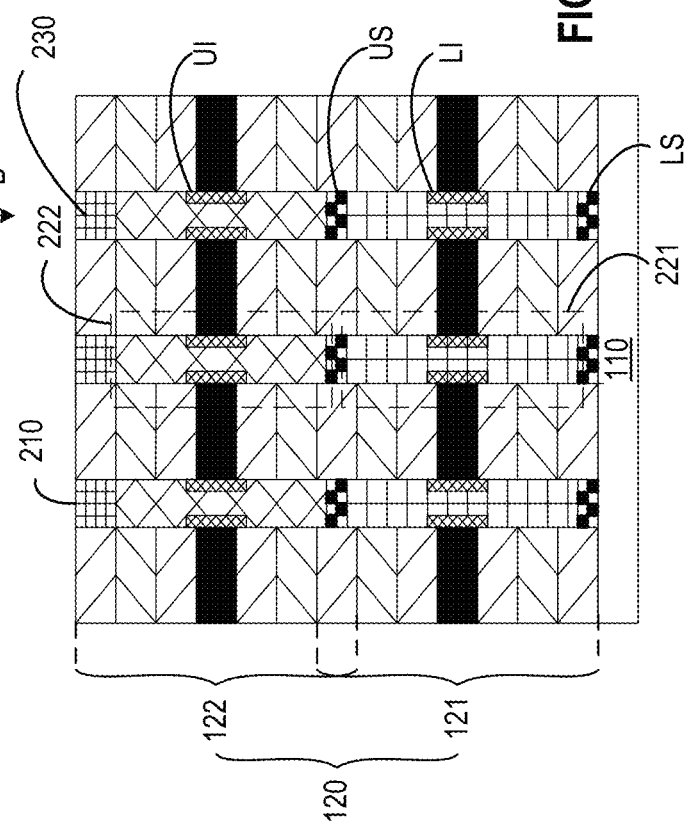

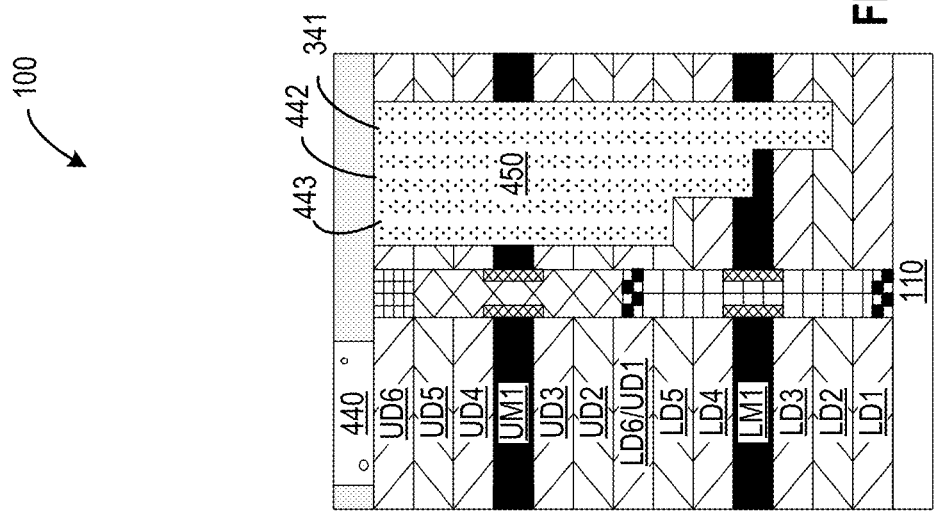
FIG. 4B
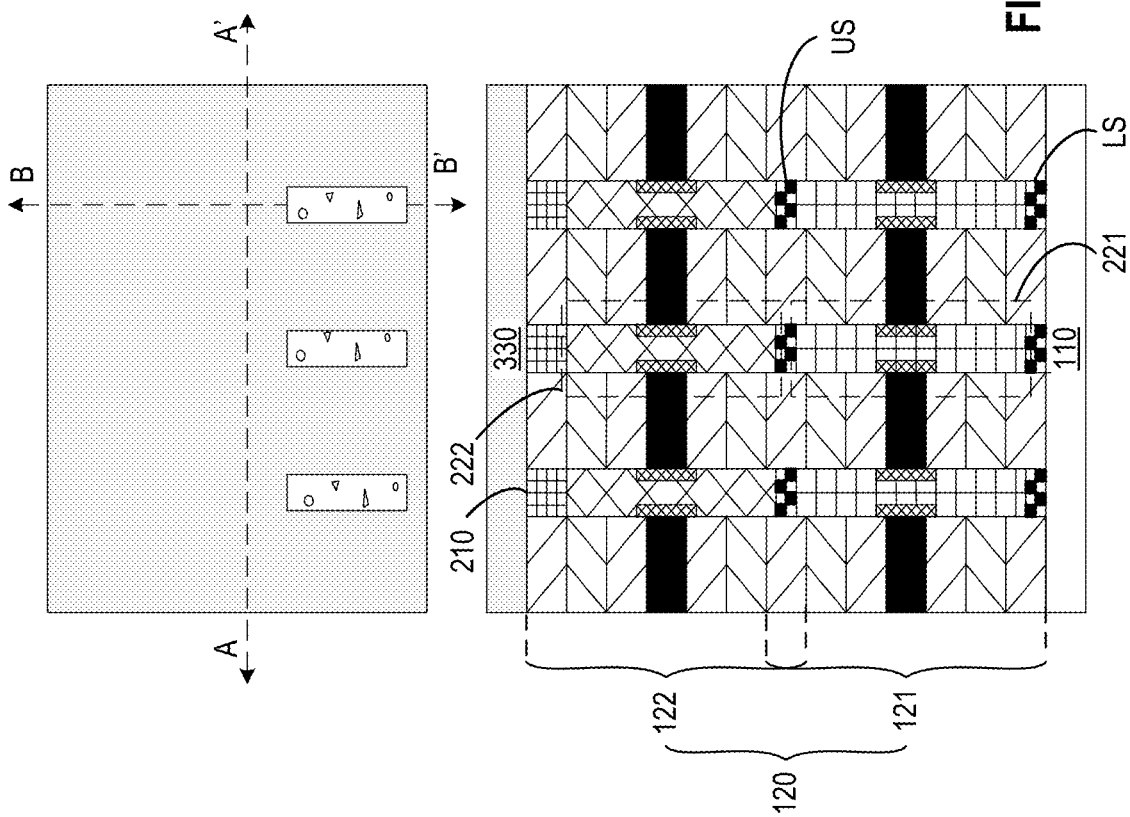
FIG. 4
FIG. 4A

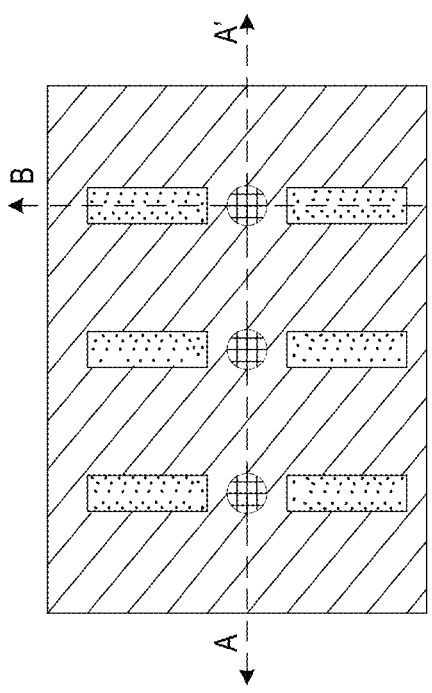
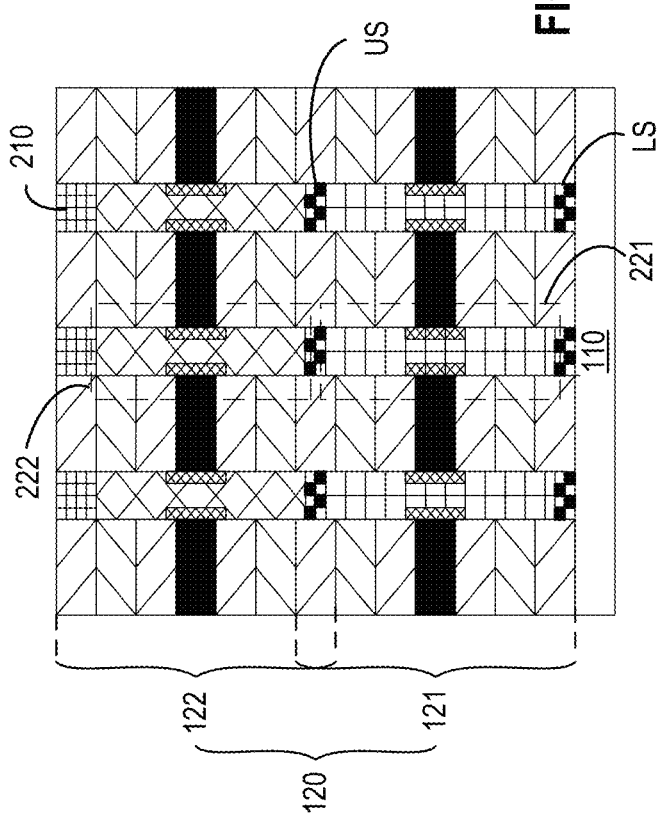
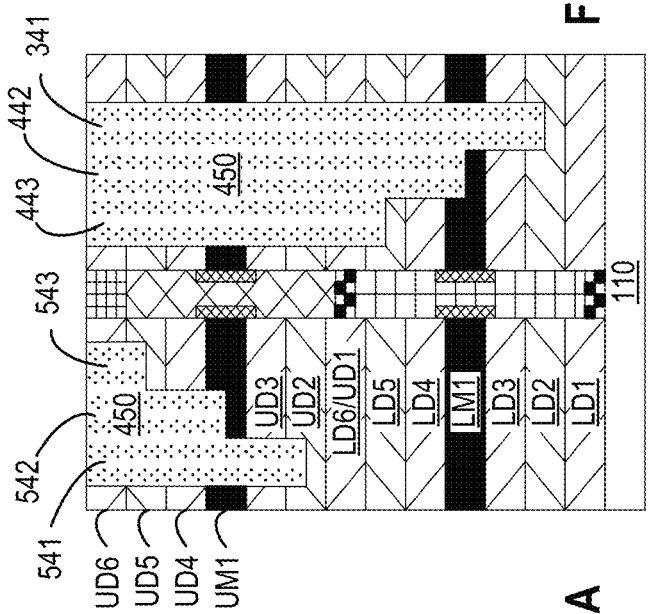
FIG. 5
FIG. 5A
FIG. 5B

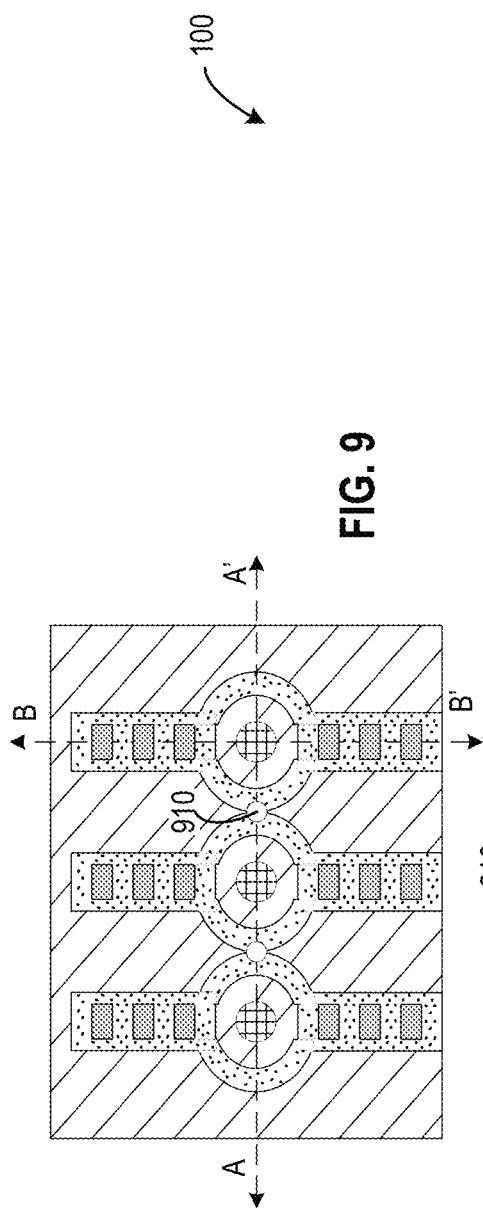
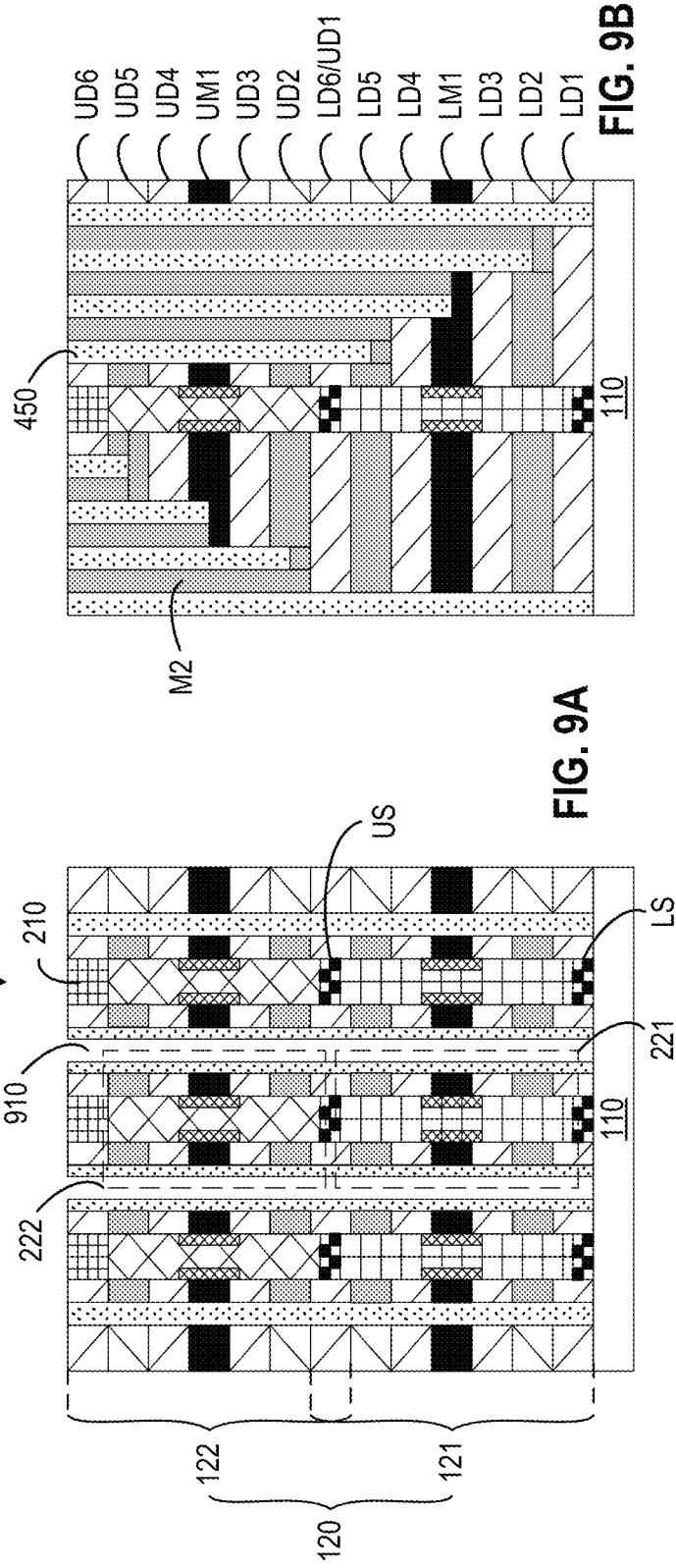
FIG. 9
FIG. 9A
FIG. 9B

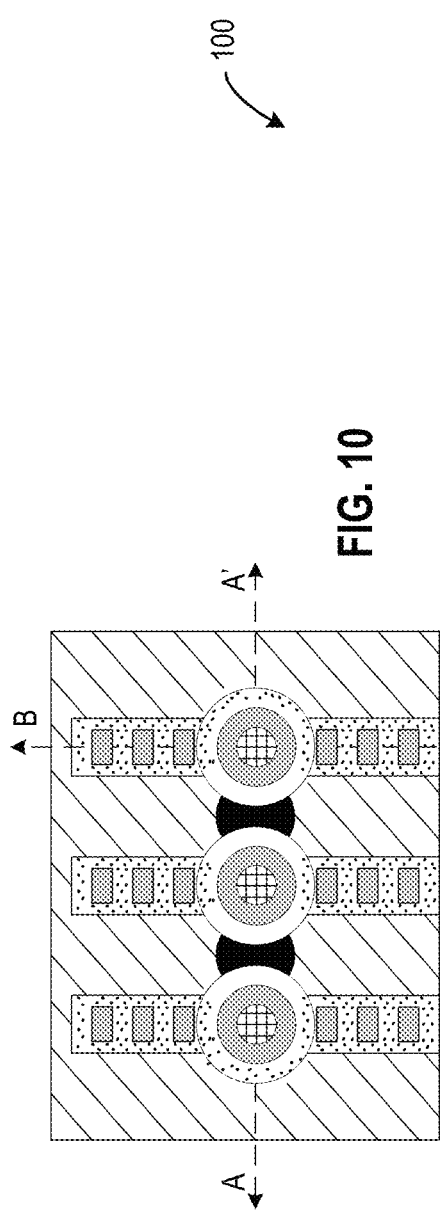
FIG. 10
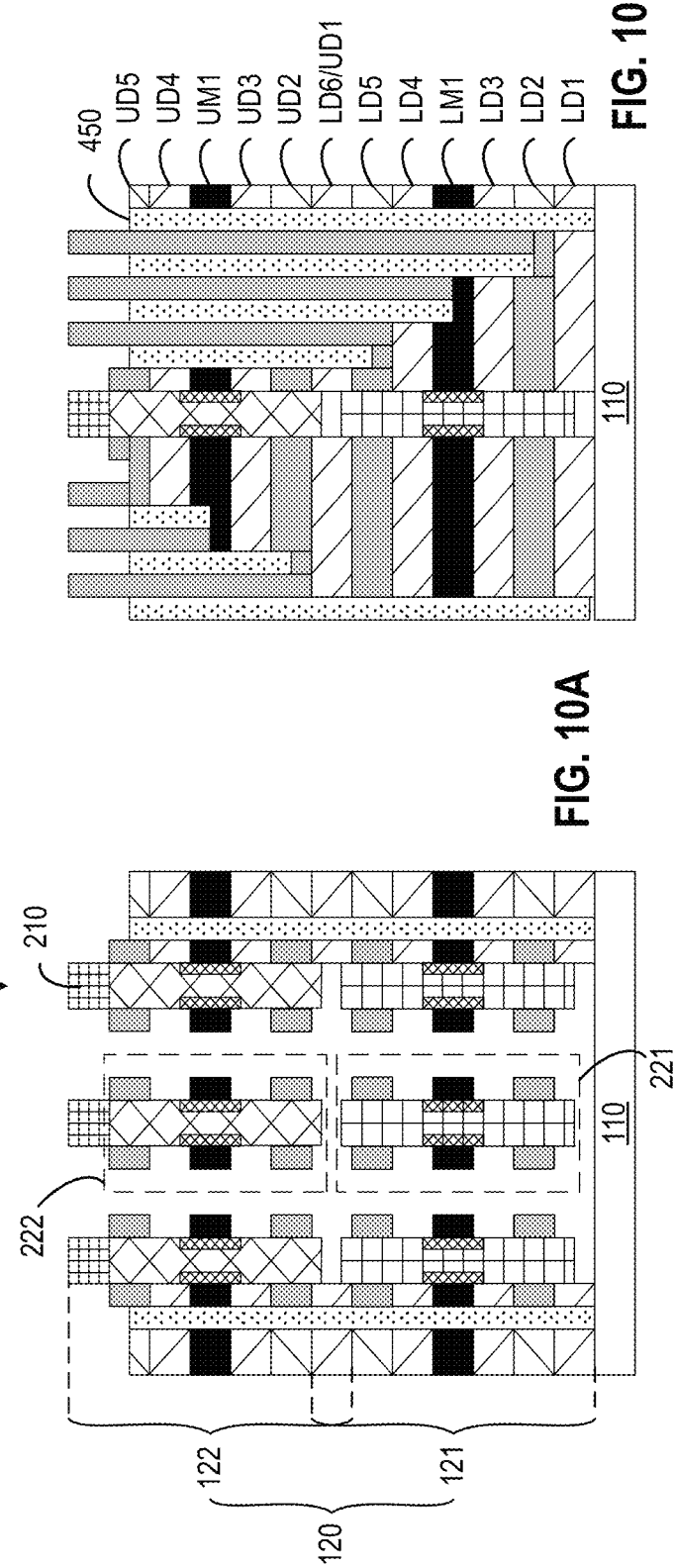
FIG. 10A
FIG. 10B

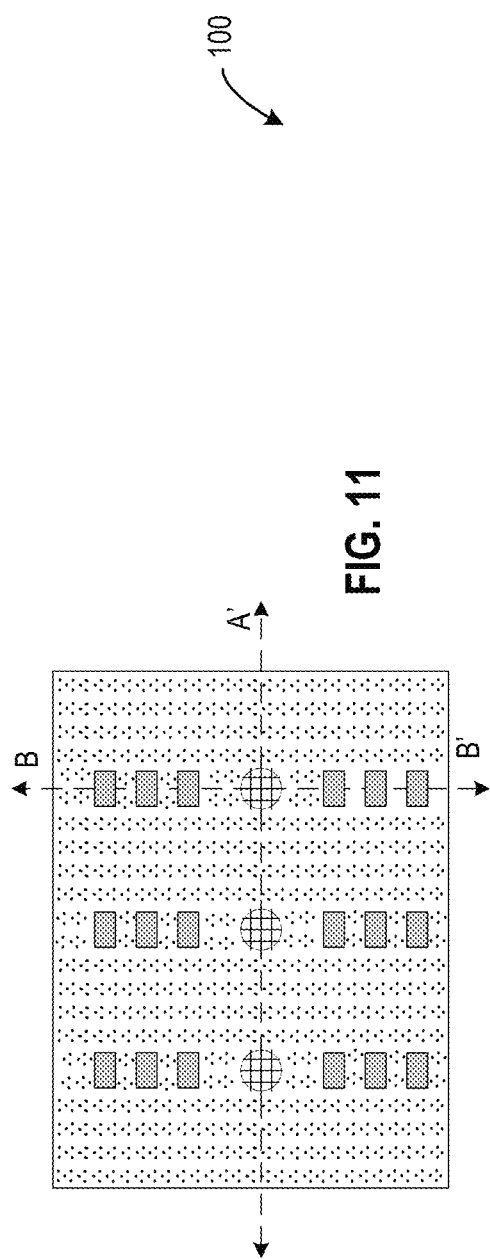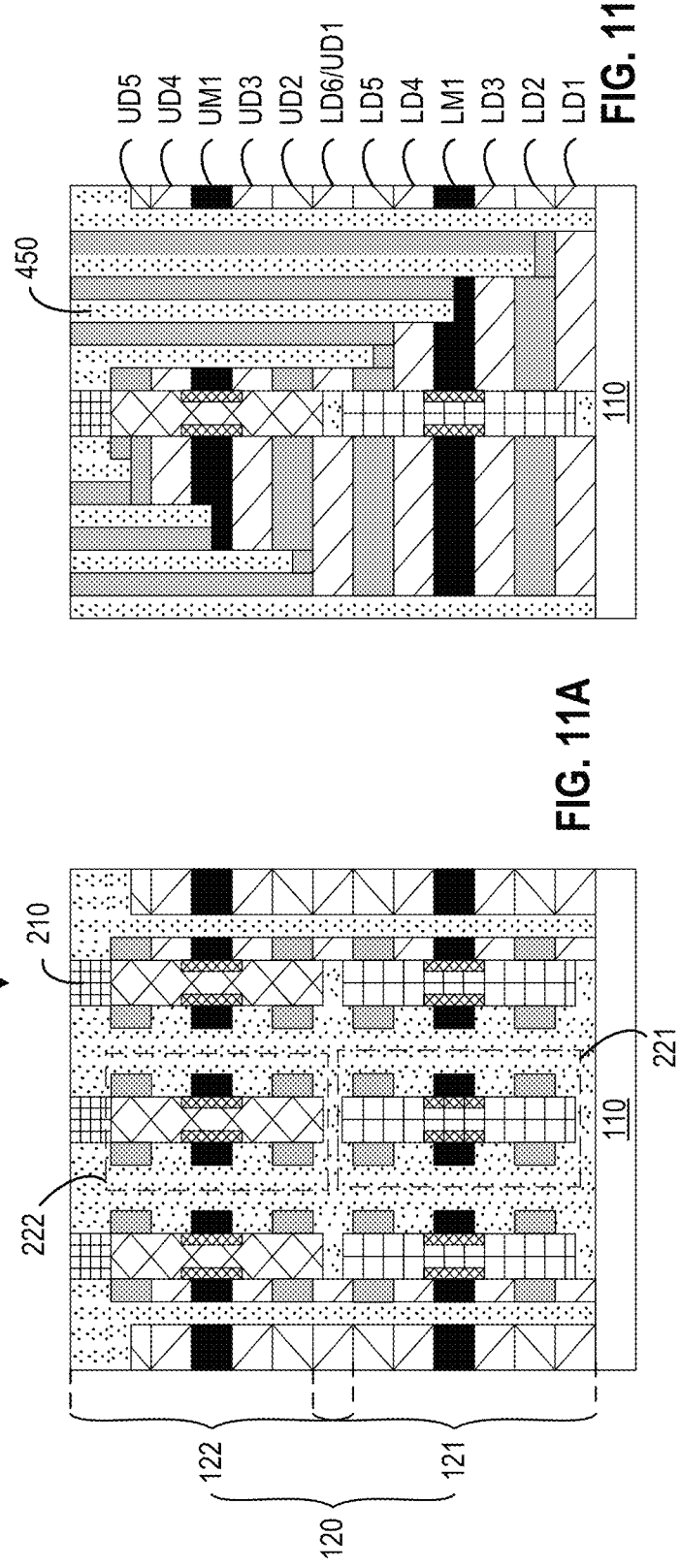

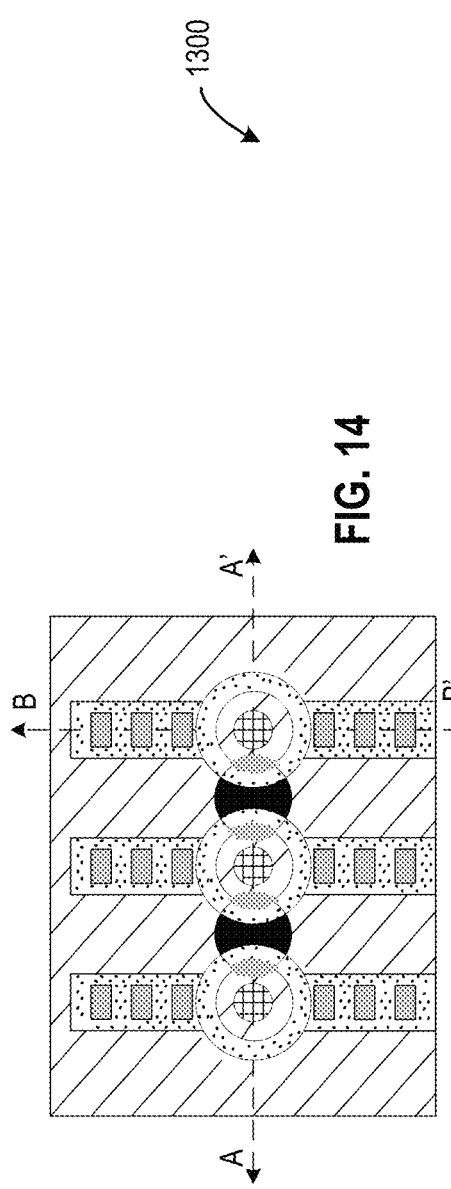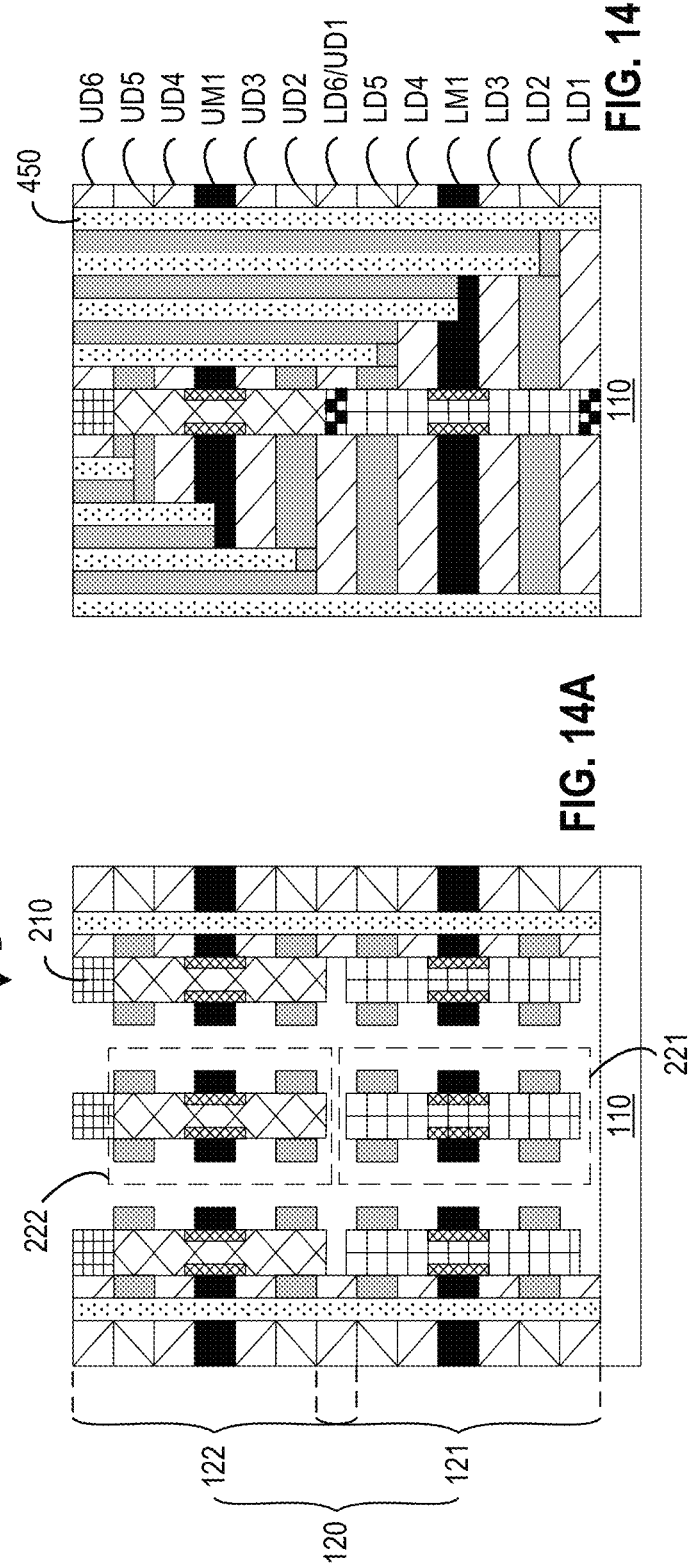

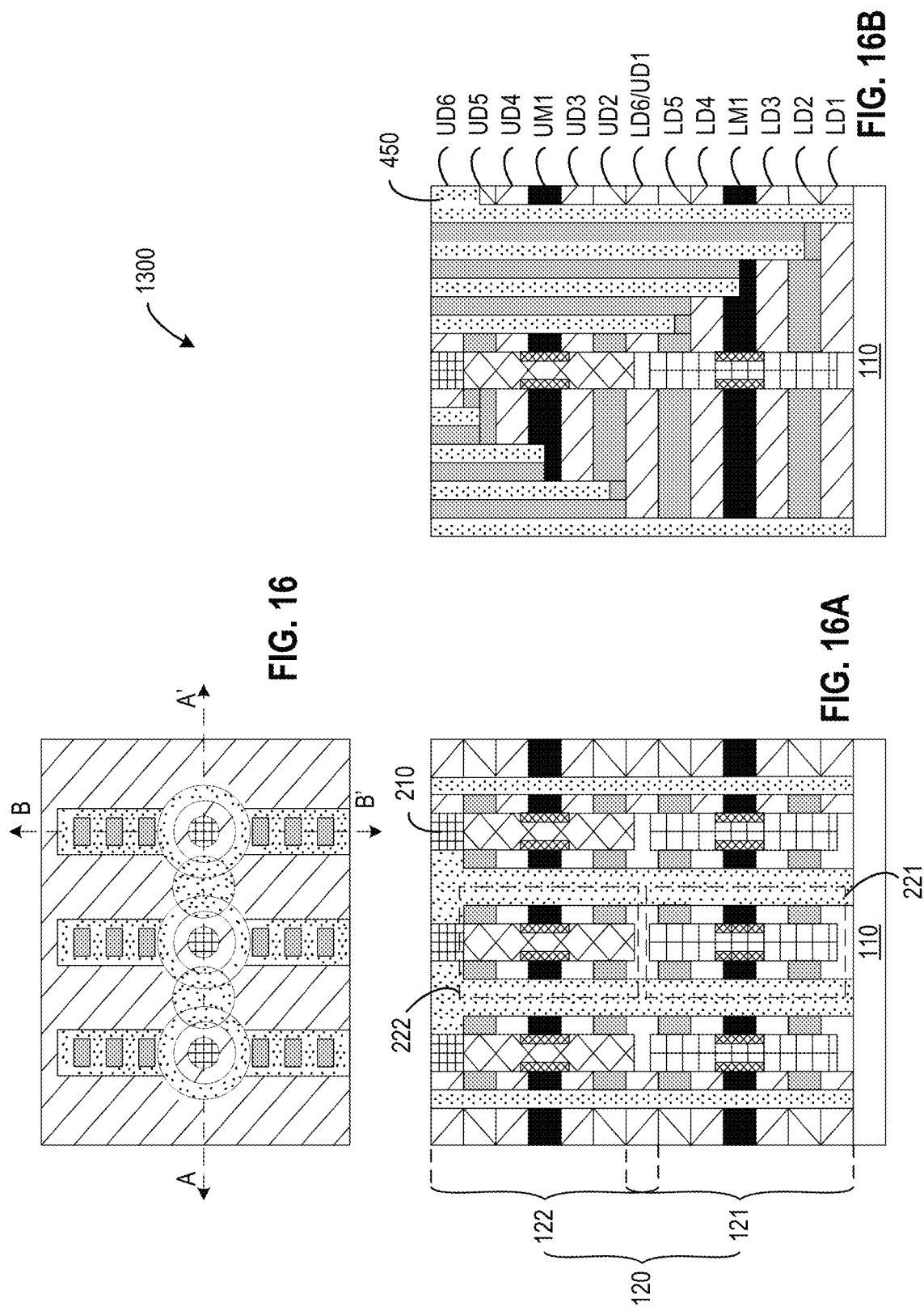

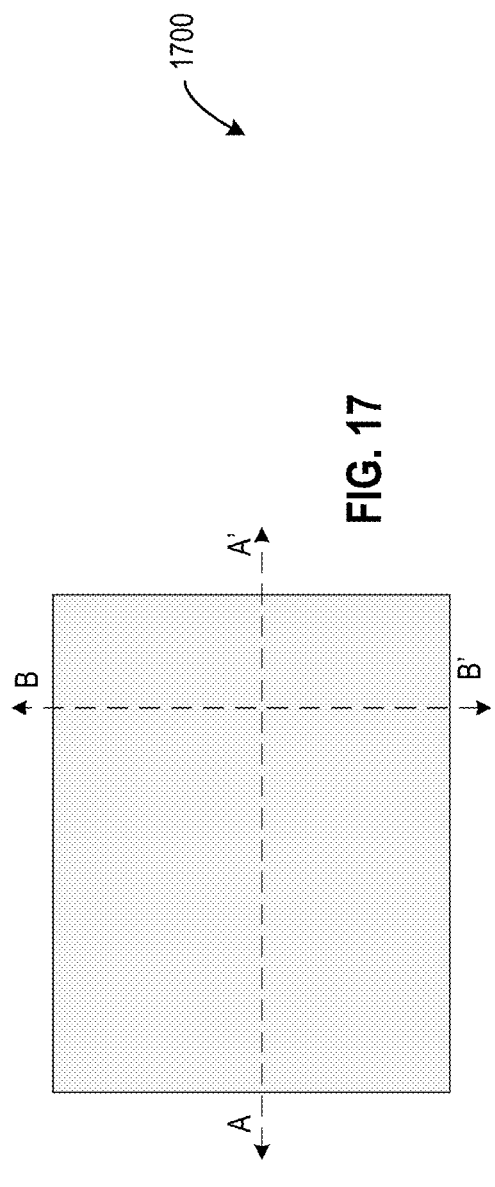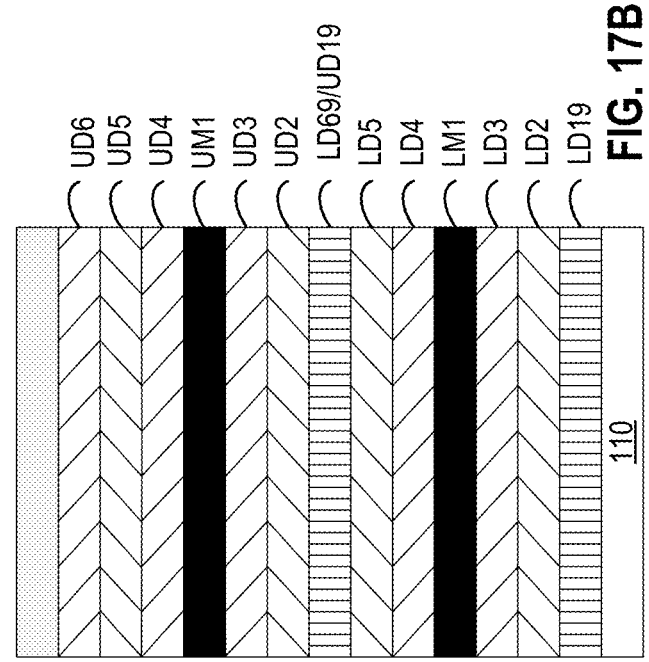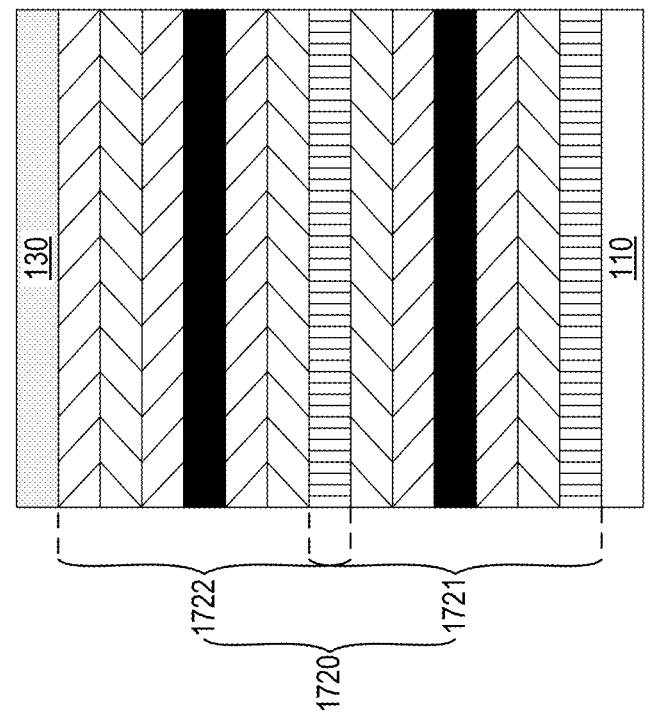

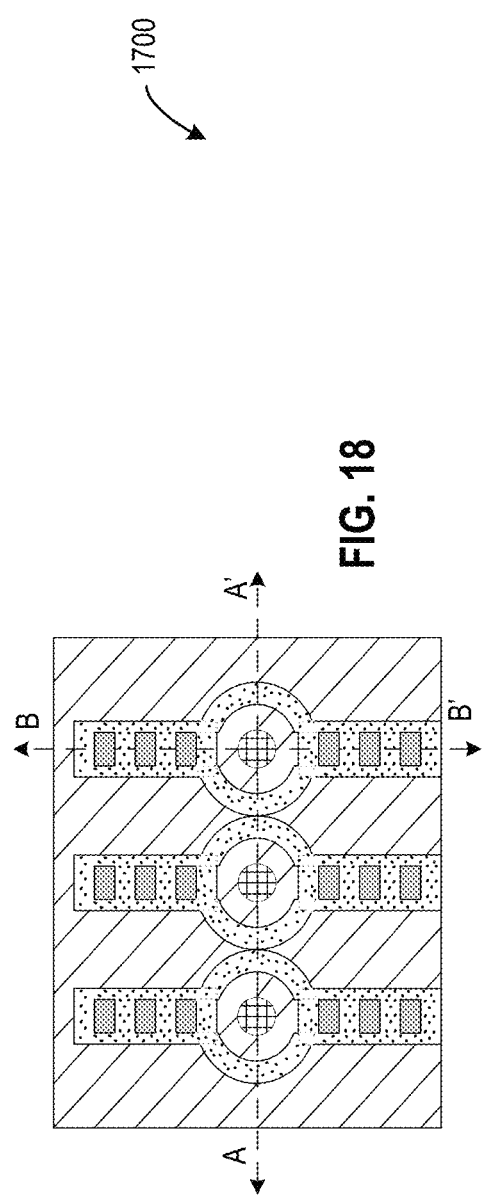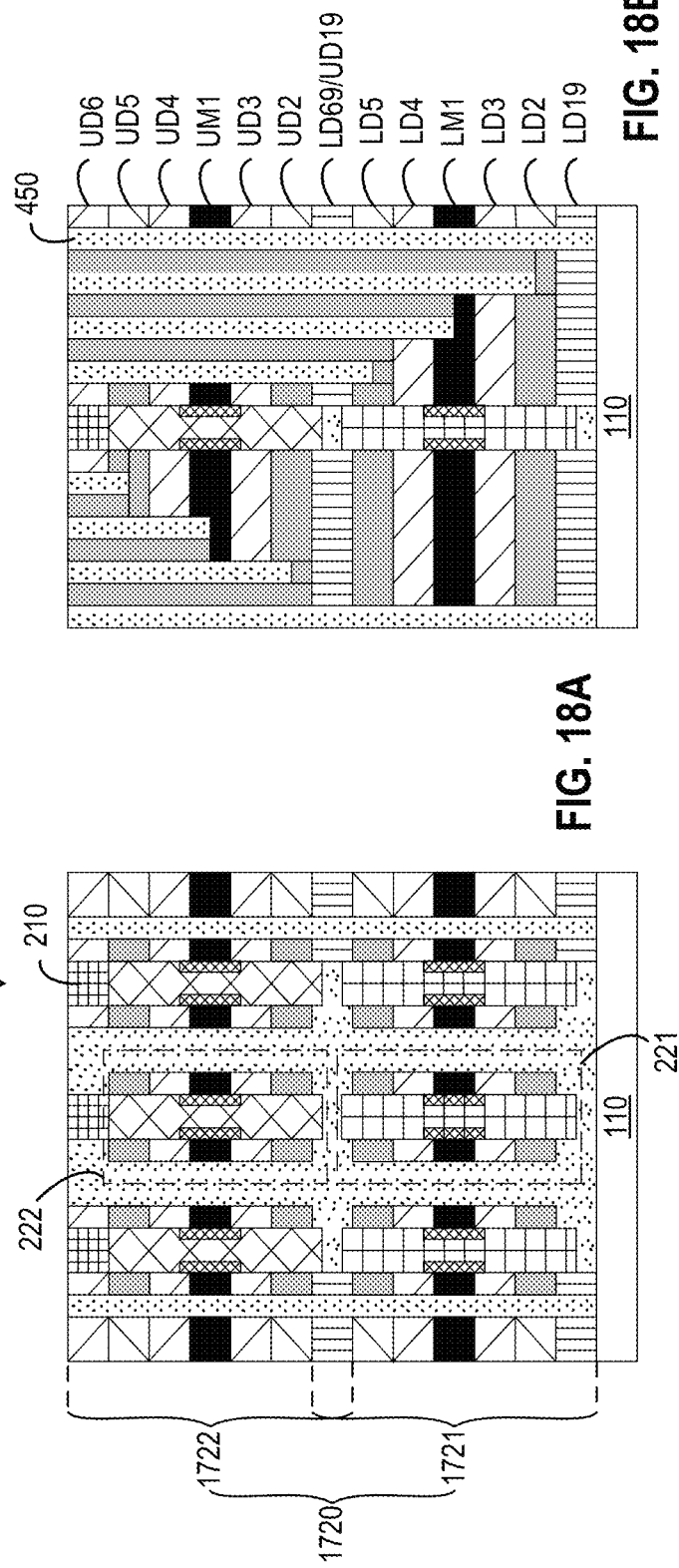
FIG. 18
FIG. 18A
FIG. 18B

FIG. 19
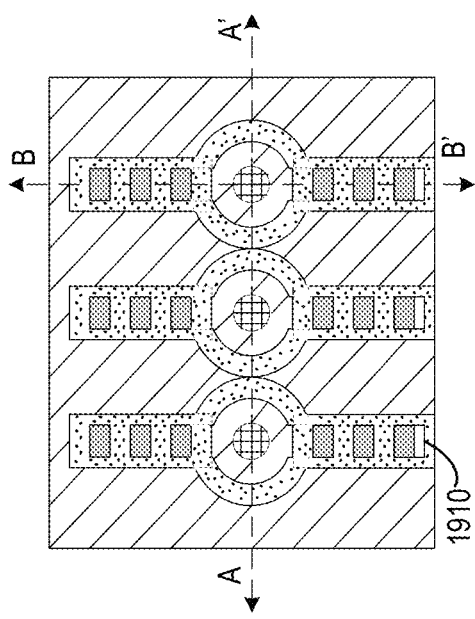
FIG. 19
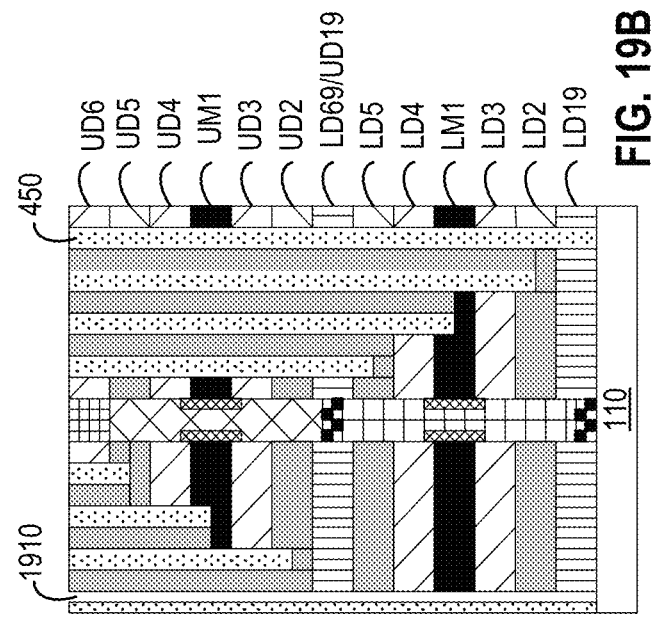
FIG. 19B
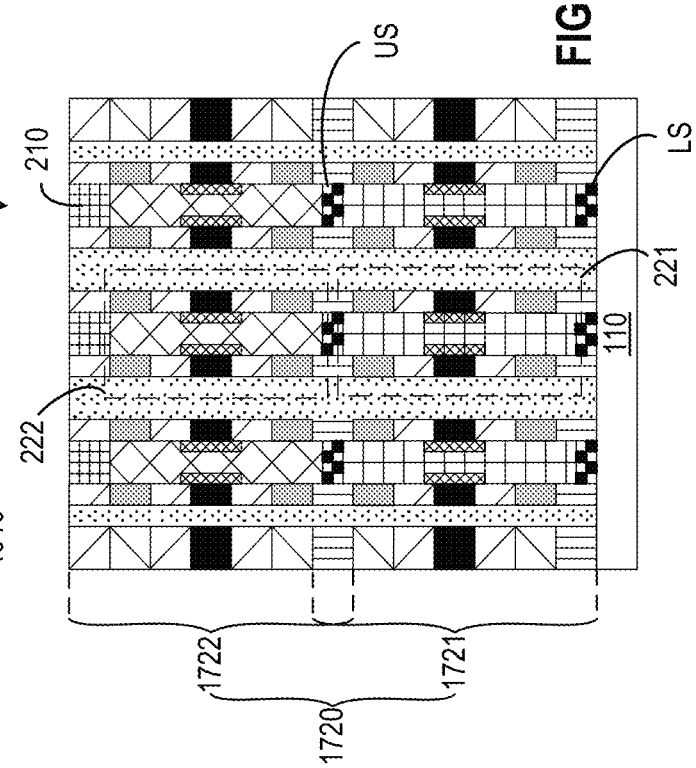
FIG. 19A

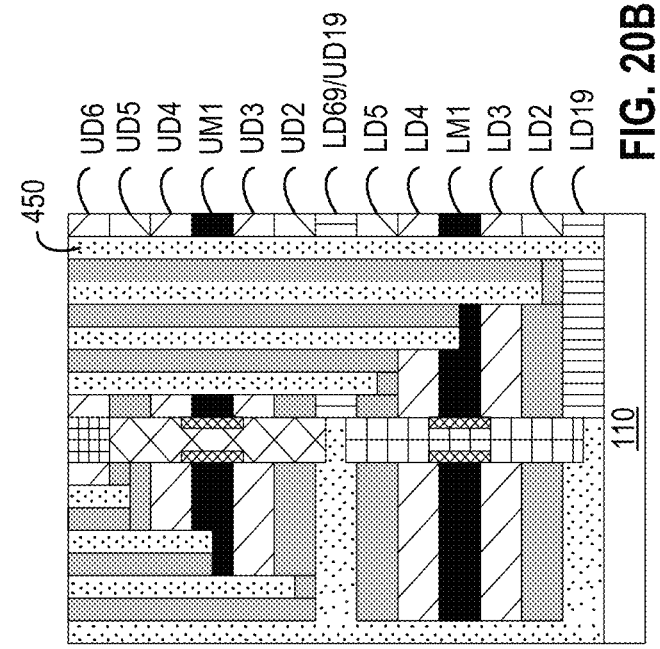
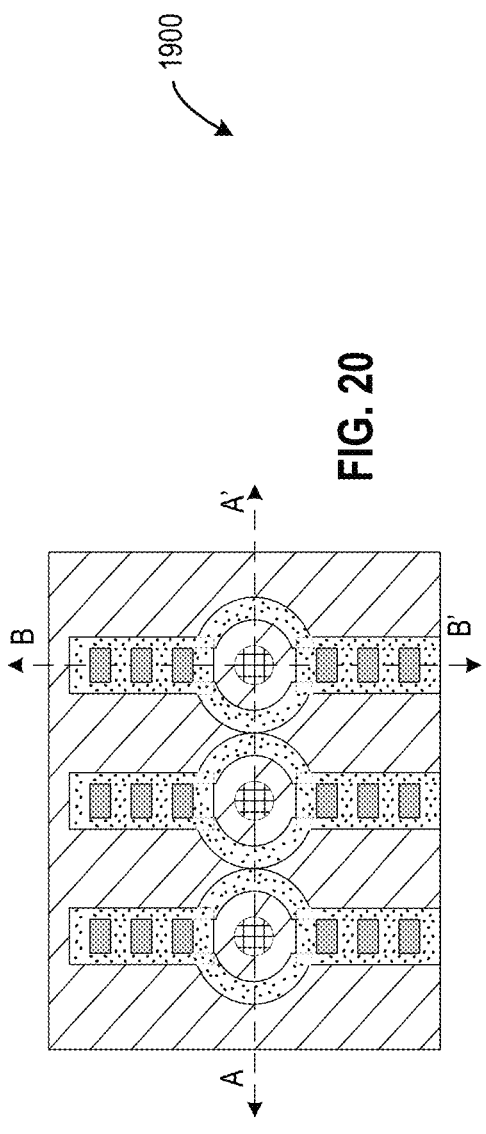
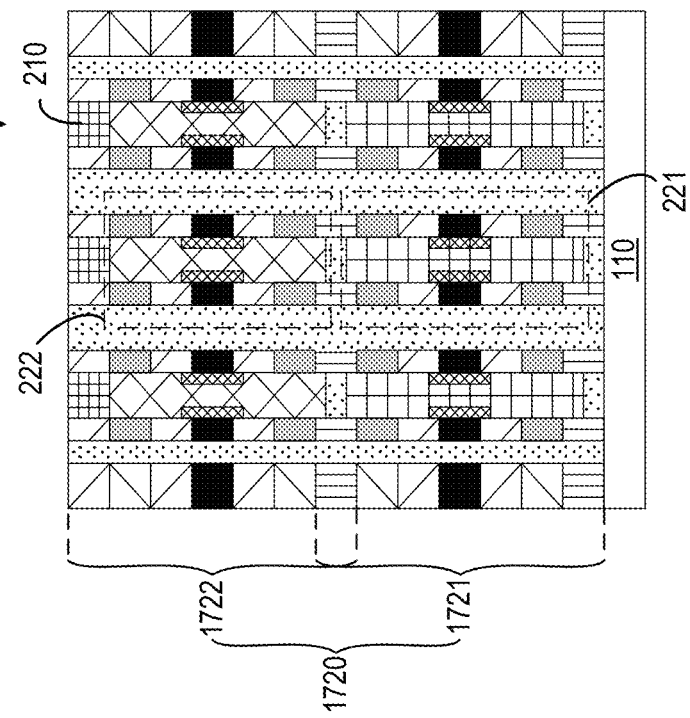
FIG. 20

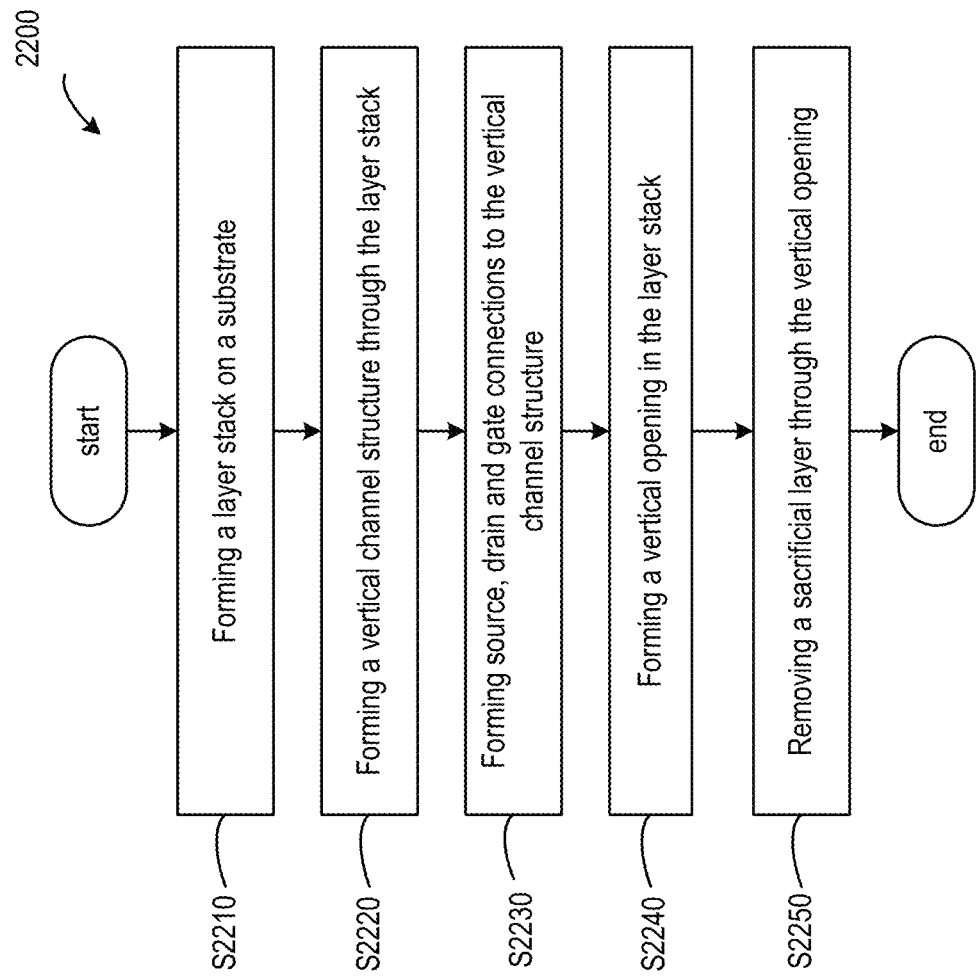

3D DEVICE LAYOUT AND METHOD USING ADVANCED 3D ISOLATION

INCORPORATION BY REFERENCE

This present disclosure claims the benefit of U.S. Provisional Application No. 63/188,033, "3D Device Layout and Method Using Advanced 3D Isolation" filed on May 13, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method for forming a semiconductor structure having separated vertical channel structures. For example, the method can include forming a layer stack on a substrate, the layer stack including alternating metal layers and dielectric layers. The method can further include forming vertically stacked lower and upper vertical channel structures that vertically extend through the layer stack, the lower and upper vertical channel structures being separated by a sacrificial layer. The method can further include forming source, drain and gate connections to the lower and upper vertical channel structures, the source, drain and gate connections extending horizontally from the lower and upper vertical channel structures and then vertically to a location above the upper vertical channel structure. The method can further include forming a vertical opening in the layer stack, and removing the sacrificial layer through the vertical opening to separate the lower and upper vertical channel structures.

In an embodiment the lower and upper vertical channel structures can be epitaxially grown on the substrate. In another embodiment, the sacrificial layer can be of a sacrificial epitaxial material and is epitaxially grown from the lower vertical channel structure. For example, the sacrificial layer can be removed by isotropic etching. As another example, the sacrificial layer can be removed by wet etching.

In an embodiment, removing the sacrificial layer can include removing a portion of one of the dielectric layers between the vertical opening and the sacrificial layer for accessing the sacrificial layer. In another embodiment, the method can further include filling the vertical opening such that an air gap remains as an isolation between the lower and upper vertical channel structures. For example, the method can further include filling the vertical opening such that an air gap between the lower and upper vertical channel structures is filled with a dielectric material.

In an embodiment, forming vertically stacked lower and upper vertical channel structures can include forming two vertically stacked lower and upper vertical channel structures, and the vertical opening can be formed between the two vertically stacked lower and upper vertical channel structures. In another embodiment, the vertical opening can be formed by the location where the source, drain and gate connections extend vertically above the upper vertical channel structure.

In an embodiment, one of the dielectric layers of the layer stack located for removing the sacrificial layer can have an etch selectivity different from other dielectric layers of the layer stack. For example, the metal layers of the layer stack can include the source, drain and gate connections extending horizontally from the lower and upper vertical channel structures. As another example, some of the dielectric layers of the layer stack can be located correspondingly to the source, drain and gate connections extending horizontally from the lower and upper vertical channel structures, and the method can further include replacing the some of the dielectric layers with another metal layer as the source, drain and gate connections extending horizontally from the lower and upper vertical channel structures.

In an embodiment, the lower and upper vertical channel structures can be separated from the substrate by another sacrificial layer, and removing the sacrificial layer through the vertical opening can include removing the sacrificial layer and the another sacrificial layer through the vertical opening.

Aspects of the present disclosure further provide another method for forming a semiconductor structure having separated substrate and vertical channel structure. For example, the method can include forming a layer stack on a substrate, the layer stack including alternating metal layers and dielectric layers. The method can further include forming a vertical channel structure that vertically extends through the layer stack, the vertical channel structure being separated from the substrate by a sacrificial layer. The method can further include forming source, drain and gate connections to the vertical channel structure, the source, drain and gate connections extending horizontally from the vertical channel structure and then vertically to a location above the vertical channel structure. The method can further include forming a vertical opening in the layer stack, and removing the sacrificial layer through the vertical opening to separate the vertical channel structure from the substrate.

In an embodiment, forming a vertical channel structure includes forming vertically stacked lower and upper vertical channel structures, the lower and upper vertical channel structures being separated by another sacrificial layer, and removing the sacrificial layer through the vertical opening can include removing the sacrificial layer and the another sacrificial layer through the vertical opening.

In an embodiment, the method can further include filling the vertical opening such that an air gap remains as an isolation between the vertical channel structure and the substrate. For example, the method can further include filling the vertical opening such that an air gap between the vertical channel structure and the substrate is filled with a dielectric material.

In an embodiment, forming a vertical channel structure can include forming two side-by-side vertical channel structures, and the vertical opening can be formed between the two vertical channel structures. In another embodiment, the vertical opening can be formed by the location where the source, drain and gate connections extend vertically above the vertical channel structure.

This summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein:

FIGS. 1-11 are top views illustrating a first exemplary method for forming a first semiconductor structure according to some embodiments of the present disclosure;

FIGS. 1A-11A are cross-sectional views of the first semiconductor structure along lines AA' of FIGS. 1-11, respectively;

FIGS. 1B-11B are cross-sectional views of the first semiconductor structure along lines BB' of FIGS. 1-11, respectively;

FIGS. 13-16 are top views illustrating a second exemplary method for forming a second semiconductor structure according to some embodiments of the present disclosure;

FIGS. 13A-16A are cross-sectional views of the second semiconductor structure along lines AA' of FIGS. 13-16, respectively;

FIGS. 13B-16B are cross-sectional views of the second semiconductor structure along lines BB' of FIGS. 13-16, respectively;

FIGS. 17 and 18 are top views illustrating a third exemplary method for forming a third semiconductor structure according to some embodiments of the present disclosure;

FIGS. 17A and 18A are cross-sectional views of the third semiconductor structure along lines AA' of FIGS. 17 and 18, respectively;

FIGS. 17B and 18B are cross-sectional views of the third semiconductor structure along lines BB' of FIGS. 17 and 18, respectively;

FIGS. 19 and 20 are top views illustrating a fourth exemplary method for forming a fourth semiconductor structure according to some embodiments of the present disclosure;

FIGS. 19A and 20A are cross-sectional views of the fourth semiconductor structure along lines AA' of FIGS. 19 and 20, respectively;

FIGS. 19B and 20B are cross-sectional views of the fourth semiconductor structure along lines BB' of FIGS. 19 and 20, respectively.

FIG. 22 is a flow chart illustrating a sixth exemplary method for forming a sixth semiconductor structure according to some embodiments of the present disclosure.

Figure 3:
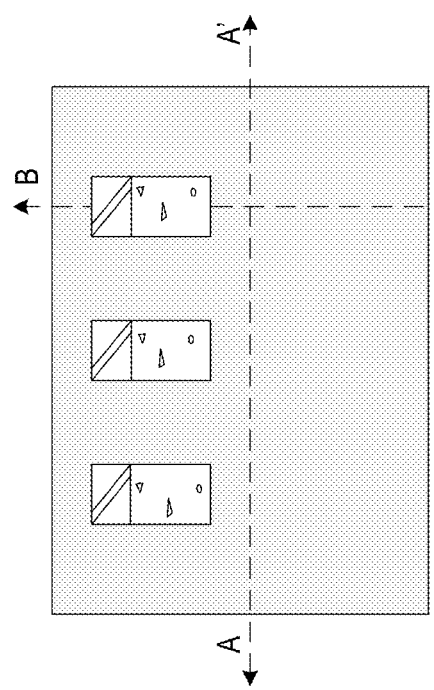

DETAILED DESCRIPTION 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array) and SoC (System on a chip)) is being pursued.

As microelectronic devices are fabricated on wafers, the wafer itself is subject to various stresses from the different materials added, removed, as well as treatment steps such as annealing. Such stresses can cause overlay problems from wafer bow, warpage and curvature. These problems can increase with wafers stacked on wafers. Techniques herein include systems and methods to enable mitigate wafer stress complications from stacked wafers and chiplets.

Techniques herein can include methods and layouts for isolating vertical field effect transistor (VFET) that have channels with a current flow path that is perpendicular to a substrate. VFET devices are formed within a layer stack of alternating layers, which can include metal layers. Techniques herein can include forming vertical channel structures with a sacrificial material, e.g., an epitaxial material. The sacrificial epitaxial material can be removed by way of an access shaft, trench or opening adjacent to the vertical channel structures. Corresponding layers with the layer stack can be removed to access the sacrificial epitaxial material, and then the sacrificial epitaxial material is removed. An air gap can be left or the air gap can optionally be filled with a dielectric material.

Using an air gap between vertical 3D devices can provide ideal isolation with enhanced high performance device performance. Example embodiments include 3D air gap isolation and partial air gap isolation. Embodiment enable very compact 3D device layout. Trenching from an intersection of two devices can provide access to the sacrificial epitaxial material, e.g., SiGe, at a shortest distance without affecting the metal strips of the device. Wet etching of all dielectric layers eliminates the options to choose specific dielectrics with etch selectivity. Thus it opens up the opportunity to choose any dielectric material combinations. Techniques herein can enable the controlled wet etching to open access to the SiGe while keeping the other layers intact which maintains the support of the whole architecture.

The order of discussion of the different steps as described herein has been presented for clarity sake. In general, these steps can be performed in any suitable order. Additionally, although each of the different features, techniques, configurations, etc. herein may be discussed in different places of the present disclosure, it is intended that each of the concepts can be executed independently of each other or in combination with each other. Accordingly, the present disclosure can be embodied and viewed in many different ways.

FIGS. 1-11 are top views illustrating a first exemplary method for forming a first semiconductor structure 100 according to some embodiments of the present disclosure. FIGS. 1A-11A are cross-sectional views of the first semiconductor structure 100 along lines AA' of FIGS. 1-11, respectively. FIGS. 1B-11B are cross-sectional views of the first semiconductor structure 100 along lines BB' of FIGS. 1-11, respectively. As shown in FIGS. 1, 1A and 1B, the first semiconductor structure 100 can be provided. In an embodiment, the first semiconductor structure 100 can have a substrate 110 (or a semiconductor material layer), e.g., a silicon substrate or a silicon on insulator (SOI) substrate, and a layer stack 120 of alternating layers sequentially formed (e.g., deposited) on the substrate 110. In an embodiment, the layer stack 120 can include multiple sub-stacks, e.g., a first (or lower) sub-stack 121 and a second (or upper) sub-stack 122, each of which can include alternating layers of three different materials.

For example, the lower sub-stack 121 can include first, third, fourth and sixth lower dielectric layers LD1, LD3, LD4 and LD6 of a first dielectric material, a lower first metal layer LM1 of a first metal material, and second and fifth lower dielectric layers LD2 and LD5 of an eighth dielectric material that is etched selectively with respect to the first dielectric material. In an embodiment, the lower first metal layer LM1 can be sandwiched between the third and fourth lower dielectric layers LD3 and LD4, the second lower dielectric layer LD2 can be sandwiched between the first and third lower dielectric layers LD1 and LD3, and the fifth lower dielectric layer LD5 can be sandwiched between the fourth and sixth lower dielectric layers LD4 and LD6.

As another example, the upper sub-stack 122 can include first, third, fourth and sixth upper dielectric layers UD1, UD3, UD4 and UD6 of the first dielectric material, an upper first metal layer UM1 of the first metal material, and second and fifth upper dielectric layer UD2 and UD5 of the eighth dielectric material. In an embodiment, the upper first metal layer UM1 can be sandwiched between the third and fourth upper dielectric layer UD3 and UD4, the second upper dielectric layer UD2 can be sandwiched between the first and third upper dielectric layer UD1 and UD3, and the fifth upper dielectric layer UD5 can be sandwiched between the fourth and sixth upper dielectric layer UD4 and UD6.

In the example embodiment shown in FIGS. 1, 1A and 1B, the lower and upper first metal layer LM1 and UM1 are of the same metal material, i.e., the first metal material. In another embodiment, the lower and upper first metal layer LM1 and UM1 can be of different metal materials. For example, different metal materials can be used for gate connections if a different metal material is desired for NMOS devices as compared to PMOS devices.

As the second and fifth lower dielectric layers LD2 and LD5 and the second and fifth upper dielectric layers UD2 and UD5 will be eventually replaced with a metal material for source/drain connections, in an embodiment the eighth dielectric material can be replaced by a metal material, which can be the same as or different from the first metal material, and the second and fifth lower dielectric layers LD2 and LD5 and the second and fifth upper dielectric layers UD2 and UD5 can be replaced with second and fifth lower first metal layers and the second and fifth upper metal layers, respectively.

In the example embodiment shown in FIGS. 1A and 1B, a transition layer between the lower sub-stack 121 and the upper sub-stack 122 can share the first dielectric material, i.e., the sixth lower dielectric layer LD6/the first upper dielectric layer UP1. In another embodiment, a third dielectric material can be used as the transition layer between the lower sub-stack 121 and the upper sub-stack 122.

The first semiconductor structure 100 can further include a capping layer 130 of a second dielectric layer deposited on the layer stack 120.

As shown in FIGS. 2, 2A and 2B, vertical channel structures, e.g., lower and upper vertical channel structures, of a plurality of semiconductor devices, can then be formed within the layer stack 120. For example, each of the semiconductor devices can include a lower vertical channel structure 221 and an upper vertical channel structure 222 stacked on the lower vertical channel structure 221. In an embodiment, the capping layer 130 can be removed, and an etch mask (not shown) can be patterned to etch openings 210 in the layer stack 120 until uncovering the silicon substrate 110 (or the silicon layer of the SOI substrate 110). For example, a photoresist (e.g., positive) layer can be applied onto the layer stack 120, a photomask can be provided to cover a portion of the photoresist layer, the photoresist layer that is not covered by the photomask can be exposed to light and be developed and removed, a portion of the layer stack 120 that is not covered by the remainder of the photoresist layer (or referred to as the etch mask) can be etched, stopping at the substrate 110, to define the (e.g., cylindrical) openings 210 for the lower and upper vertical channel structures 221 and 222 to be formed therein, and the etch mask can be removed (e.g., stripped).

A first (or lower) sacrificial layer LS can then be formed on the uncovered substrate 110 for later removal to isolate the lower vertical channel structure 221 from the substrate 110. For example, an epitaxial material, e.g., SiGe, can be epitaxially grown from a seed layer, i.e., the uncovered silicon substrate 110 to form the lower sacrificial layer LS. Then p- or n-doped silicon can be grown on the lower SiGe sacrificial layer LS to form the lower vertical channel structure 221. A first (or lower) high-k interface LI for a gate contact can be formed between the lower first metal layer LM1 and the lower vertical channel structure 221 by conformal deposition (e.g., atomic layer deposition (ALD)) and directional etch back followed by isotropic removal after growth of the p- or n-doped silicon extending above the lower first metal layer LM1.

A second (or upper) sacrificial layer US, e.g., SiGe, can be formed on (or epitaxially grown from) the lower vertical channel structure 221 for later removal to isolate the upper vertical channel structure 222 from the lower vertical channel structure 221. P- or n-doped silicon can then be grown on the upper SiGe sacrificial layer US to form the upper vertical channel structure 222. A second (or upper) high-k interface UI for a gate contact can be formed between the upper first metal layer UM1 and the upper vertical channel structure 222 by conformal deposition (e.g., ALD) and directional etch back followed by isotropic removal after growth of the p- or n-doped silicon extending above the upper first metal layer UM1. A capping layer 230 of a third dielectric material can be formed to cap the vertical channel structures 221 and 222.

Figure 3B:
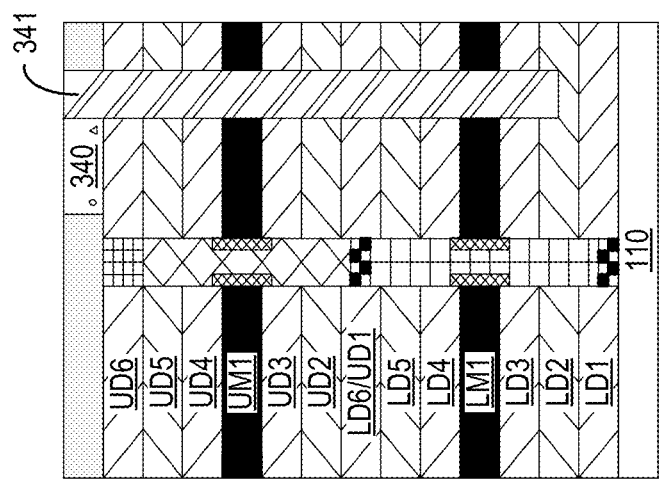
Figure 3A:
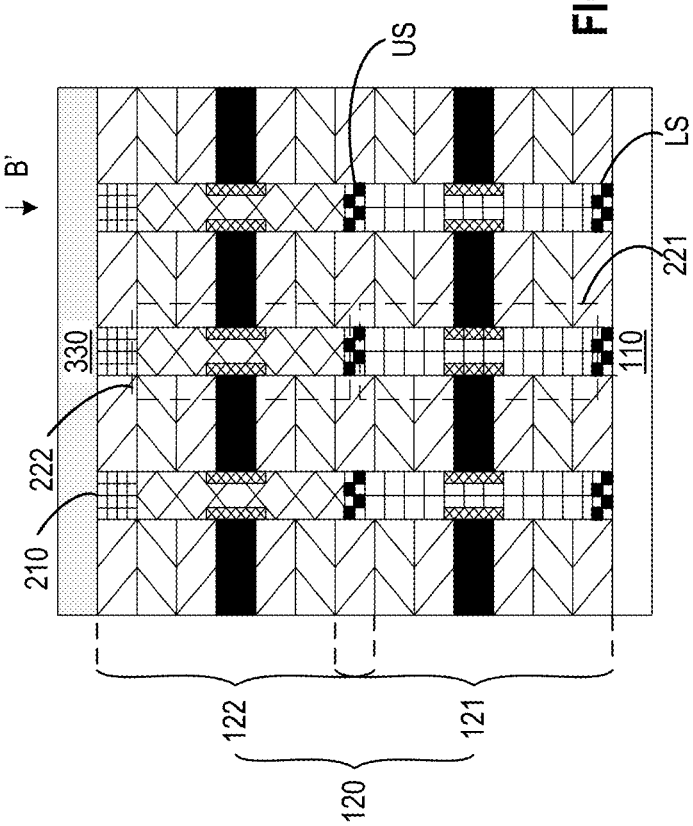

As shown in FIGS. 3, 3A and 3B, first lower contact openings to the second lower dielectric layer LD2 of the eighth dielectric material can be formed within the layer stack 120 for metal contacts to be formed therein. In an embodiment, a dielectric layer 330 of a seventh dielectric material can be formed on the layer stack 120, an etch mask (not shown) can be formed to etch certain regions of the dielectric layer 330 corresponding to the lower and upper vertical channel structures 221 and 222, the certain regions can be filled with a second dielectric material and planarized via, for example, chemical-mechanical polishing (CMP), to form lower contained dielectric layers 340, and the etch mask can be stripped. In another embodiment, another etch mask (not shown) can be formed to directionally etch a first lower contact opening 341 of each of the lower contained dielectric layers 340, stopping at or below a portion of the second lower dielectric layer LD2, a sixth dielectric material can be deposited in the first lower contact openings 341, and the another etch mask can be stripped.

As shown in FIGS. 4, 4A and 4B, second and third lower contact openings to the lower first metal layer LM1 and the fifth lower dielectric layer LD5 of the eighth dielectric material, respectively, can be formed within the layer stack 120 for metal contacts to be formed therein. For example, an etch mask (not shown) can be formed to directionally etch a second lower contact opening 442 of each of the lower contained dielectric layers 340, stopping at or below a portion of the lower first metal layer LM1, the sixth dielectric material can also be deposited in the second lower contact openings 442, and the etch mask can be stripped. As another example, another etch mask (not shown) can be formed to directionally etch a third lower contact opening 443 of each of the lower contained dielectric layers 340, stopping at or below a portion of the lower fifth lower dielectric layer LD5, the sixth dielectric material can also be deposited in the third lower contact openings 443, and the another etch mask can be stripped. In some embodiments, a layer of protective material may be conformally or selectively deposited within a lower contact opening after etching such opening in order to protect materials uncovered by such opening from exposure to an etch process for forming a subsequent lower contact opening. As shown in FIGS. 4, 4A and 4B, the sixth dielectric material deposited in the first to third lower contact openings 341, 442 and 443 can have a staircase profile.

FIGS. 4, 4A and 4B further show that the sixth dielectric material deposited in the first to third lower contact openings 341, 442 and 443 can be cleaned and replaced with a fifth dielectric material 450, and the fifth dielectric material 450 can be planarized via CMP.

FIGS. 4, 4A and 4B further show that upper contained dielectric layers 440 can be formed by repeating the steps of forming the lower contained dielectric layers 340 shown in FIGS. 3, 3A and 3B.

As shown in FIGS. 5, 5A and 5B, first to third upper contact openings 541 to 543 to the second upper dielectric layer UD2 of the eighth dielectric material, the upper first metal layer UM1, and the fifth upper dielectric layer UD5 of the eighth dielectric material, respectively, can be formed within the layer stack 120 for metal contacts to be formed therein by repeating the steps of forming the first to third lower contact openings 341, 442 and 443 shown in FIGS. 4, 4A and 4B, and the sixth dielectric material can be sequentially deposited in the first to third upper contact openings 541 to 543 and can be cleaned and replaced with the fifth dielectric material 450. For example, the first to third upper contact openings 541 to 543 may be sequentially etched and protected with a layer of protective material which protects the formed opening from exposure to an etch process for forming a subsequent opening. As shown in FIGS. 5, 5A and 5B, the fifth dielectric material 450 deposited in the first to third upper contact opening 541 to 543 can also have a staircase profile.

Figure 6:
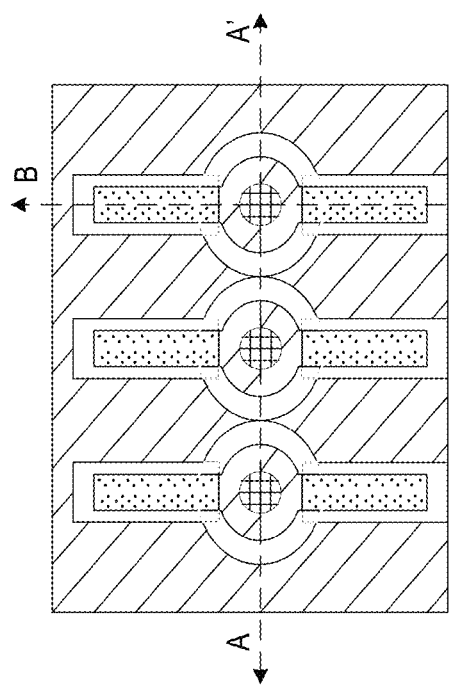
Figure 6B:
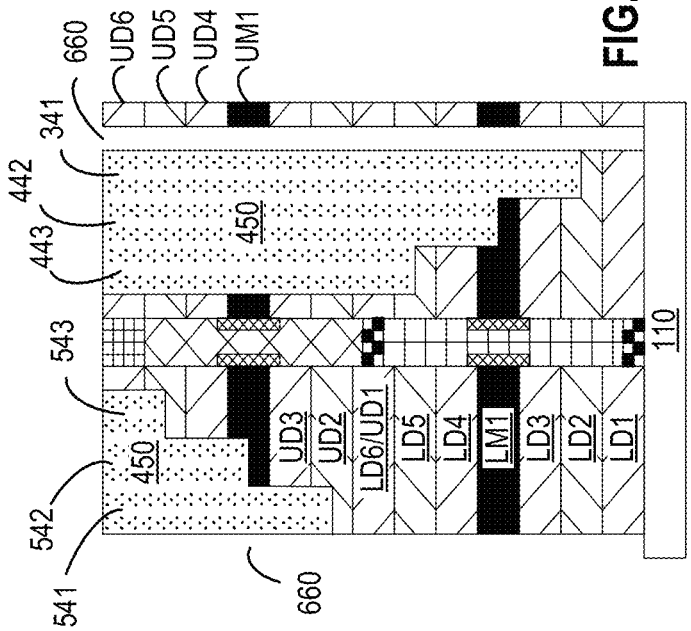
Figure 6A:
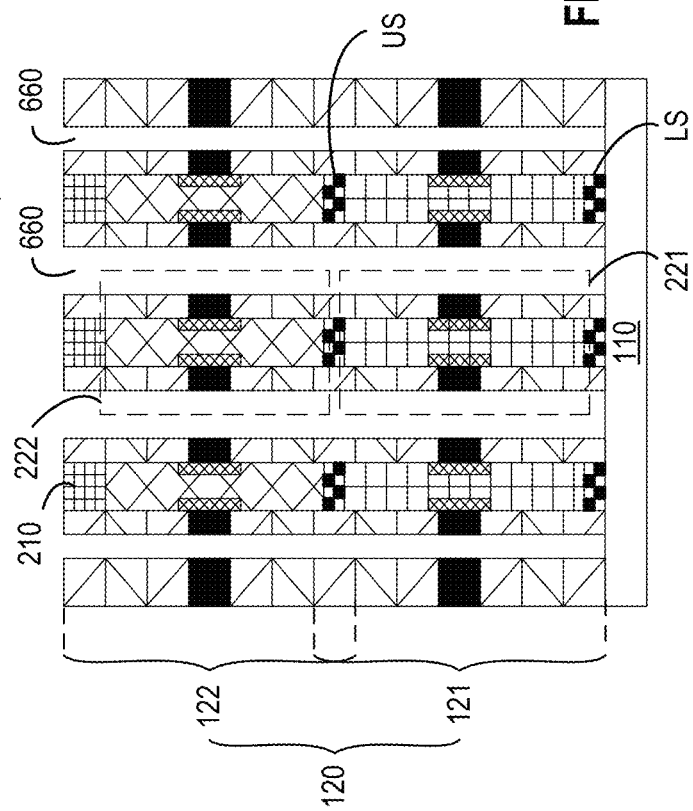

As shown in FIGS. 6, 6A and 6B, the individual semiconductor devices can be separated from one another. In an embodiment, an etch mask (not shown) can be formed around the layer stack 120 of the lower and upper vertical channel structures 221 and 222 and the fifth dielectric material 450 deposited in the first to third lower contact openings 341, 442 and 443 and the first to third upper contact openings 541 to 543 to directionally etch all of the layers of the layer stack 120, stopping at the substrate 110, to form spaces 660 that separate the individual semiconductor devices from one another. The etch mask can then be stripped.

Figure 7B:
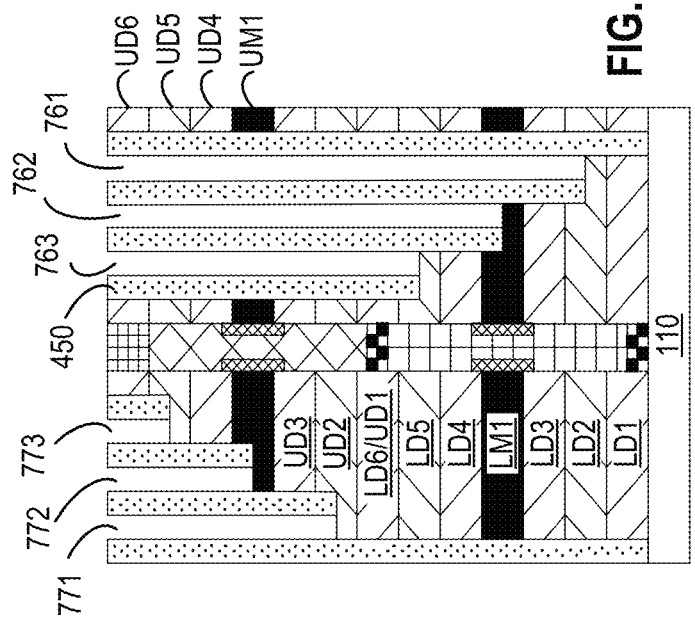
Figure 7:
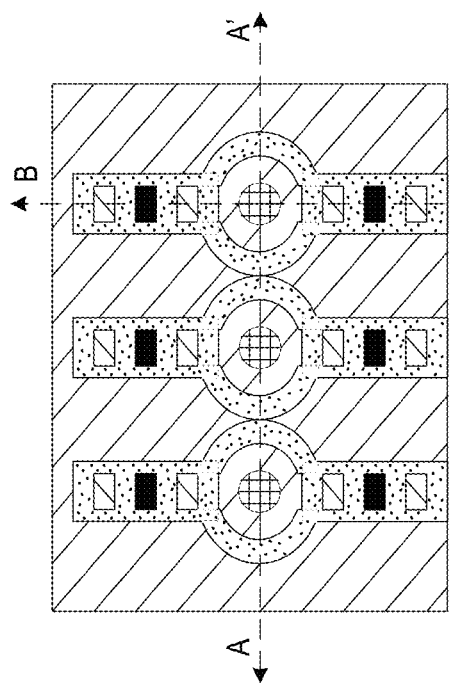
Figure 7A:
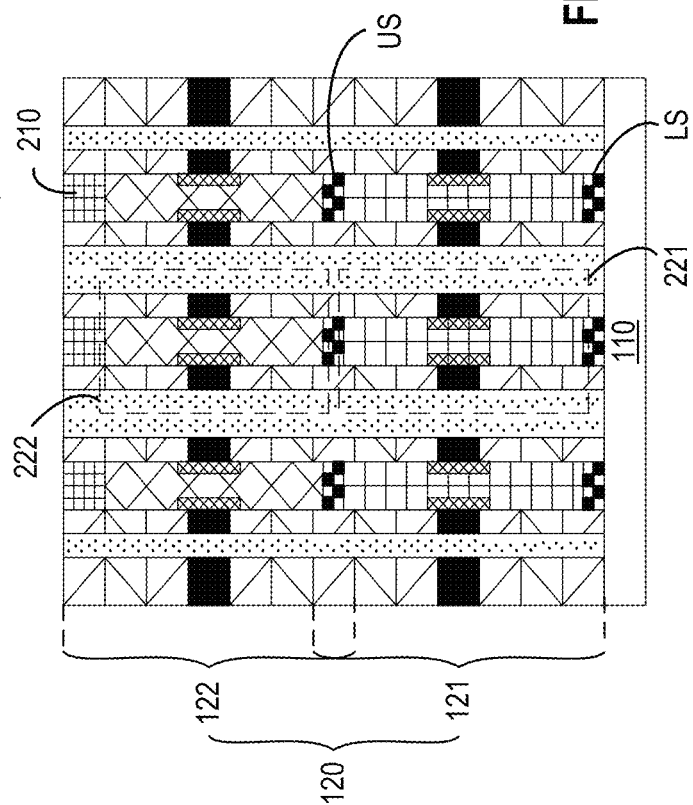

As shown in FIGS. 7, 7A and 7B, the individual semiconductor devices can be insulated from one another. In an embodiment, the spaces 660 can be filled with a dielectric material, e.g., the fifth dielectric material 450. The fifth dielectric material 450 can thus surround the layer stack 120 of the lower and upper vertical channel structures 221 and 222, and the individual semiconductor devices can thus be insulated from one another by the fifth dielectric material 450.

FIGS. 7, 7A and 7B further show that six vertical openings can be formed within the fifth dielectric material 450 deposited in the first to third lower contact openings 341, 442 and 443 and the first to third upper contact openings 541 to 543, respectively. For example, an etch mask can be patterned to have six holes corresponding to the cross sections of first to third lower vertical openings 761 to 763 and first to third upper vertical openings 771 to 773, respectively, to directionally etch the first to third lower vertical openings 761 to 763 and the first to third upper vertical openings 771 to 773, stopping at or below a portion of the second lower dielectric layer LD2, the lower first metal layer LM1, the fifth lower dielectric layer LD5, the second upper dielectric layer UD2, the upper first metal layer UM1 and the fifth upper dielectric layer UD5, respectively.

Figure 8:
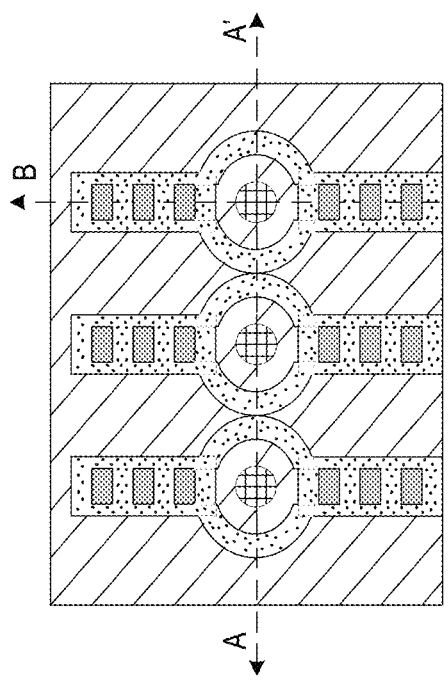
Figure 8B:
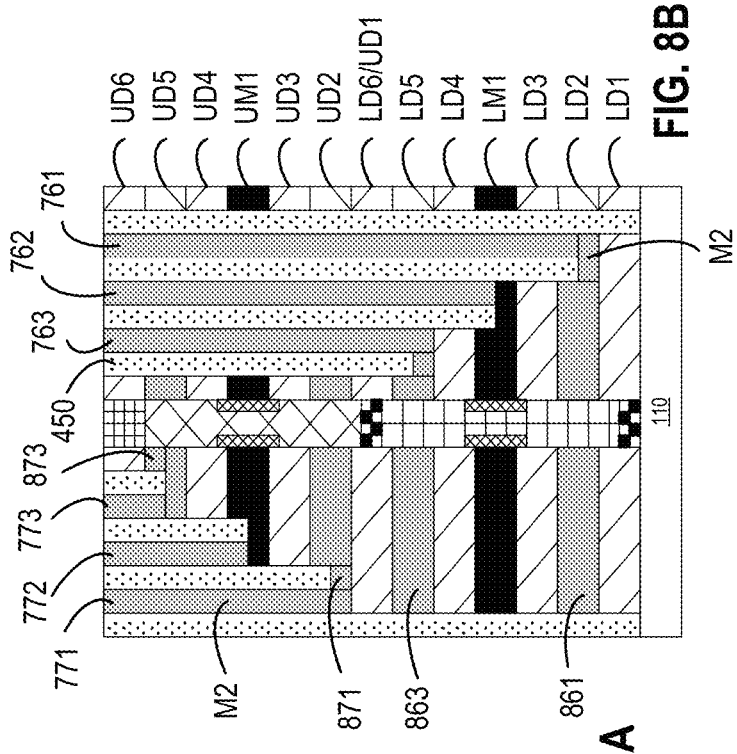
Figure 8A:
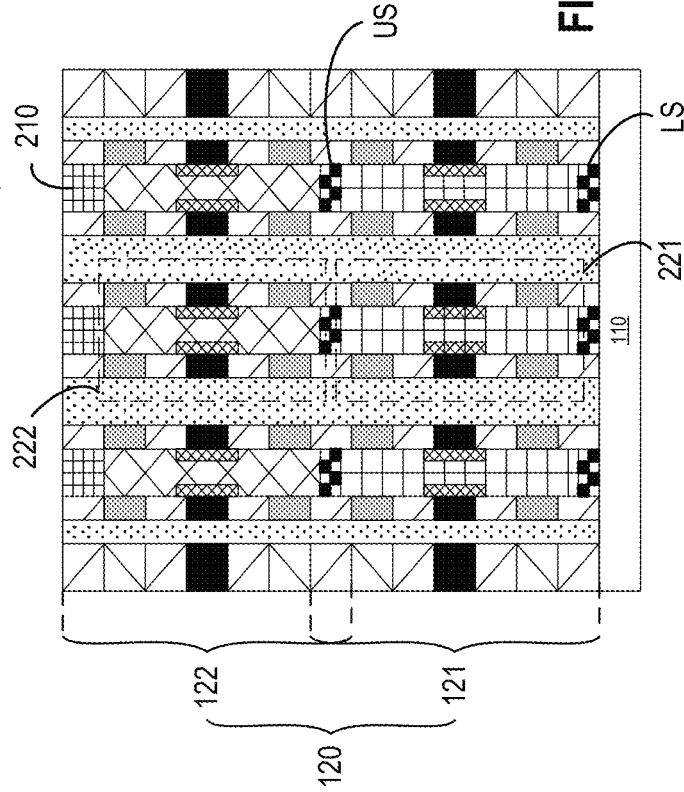

As shown in FIGS. 8, 8A and 8B, the etch mask can be further used to isotropically etch the second lower dielectric layer LD2, the fifth lower dielectric layer LD5, the second upper dielectric layer UD2 and the fifth upper dielectric layer UD5 through the first and third lower vertical openings 761 and 763 and the first and third upper vertical openings 771 and 773, respectively, which results in first and third lower horizontal openings 861 and 863 and first and third upper horizontal openings 871 and 873 to the sides of the lower and upper vertical channel structures 221 and 222, respectively. The etch mask can then be stripped.

FIGS. 8, 8A and 8B further show that the first to third lower vertical openings 761 to 763, the first to third upper vertical openings 771 to 773, the first and third lower horizontal openings 861 and 863, and the first and third upper horizontal openings 871 and 873 can be filled with a second metal layer M2 to form source, drain and gate connections to the lower and upper vertical channel structures 221 and 222, the source, drain and gate connections extending horizontally from the lower and upper vertical channel structures 221 and 222 and then vertically to a location above the upper vertical channel structure 222. For example, the second metal layer M2 can be the same as or different from the lower and upper first metal layers LM1 and LM2. The second metal layer M2 can be formed by ALD or electroplating, which enable growing thick second metal layer M2 irrespective of the bending of metal contact openings (including the vertical openings 761 to 763, 771 to 773 and the horizontal openings 861, 863, 871 and 873). Overfill of the second metal layer M2 can be removed by, for example, CMP.

As described in paragraph [0040], since the second and fifth lower dielectric layers LD2 and LD5 and the second and fifth upper dielectric layers UD2 and UD5 will be eventually replaced with a metal material, e.g., the second metal layer M2, as shown in FIGS. 8, 8A and 8B, for source/drain connections, the eighth dielectric material can also be replaced by the second metal layer M2. In such the case scenario, the isotropic etching of the second lower dielectric layer LD2, the fifth lower dielectric layer LD5, the second upper dielectric layer UD2 and the fifth upper dielectric layer UD5 through the first and third lower vertical openings 761 and 763 and the first and third upper vertical openings 771 and 773, respectively, can be omitted. Besides, the directional etching of the first to third lower vertical openings 761 to 763 and the first to third upper vertical openings 771 to 773 can stop at the second lower metal layer (which replaces the second lower dielectric layer LD2), the lower first metal layer LM1, the fifth lower metal layer (which replaces the fifth lower dielectric layer LD5), the second upper metal layer (which replaces the second upper dielectric layer UD2), the upper first metal layer UM1 and the fifth upper metal layer (which replaces the fifth upper dielectric layer UD5), respectively, and the second metal layer M2 can fill the first to third lower vertical openings 761 to 763 and the first to third upper vertical openings 771 to 773 only.

As shown in FIGS. 9, 9A and 9B, an etch mask can be formed to etch a trench (or shaft or opening) 910, e.g., a round vertical trench, at a junction point of two consecutive semiconductor devices, and directional etching of all layers of the layer stack 120 can be performed to uncover the substrate 110. In an embodiment, the trenches 910 can enable access to remove the first lower dielectric layer LD1 and the sixth lower dielectric layer LD6 (or the first upper dielectric layer UD1) to uncover the lower sacrificial layer LS and the upper sacrificial layer US, respectively. The etch mask can then be stripped.

As shown in FIGS. 10, 10A and 10B, wet etching of the first lower dielectric layer LD1 (and the third and fourth lower dielectric layers LD3 and LD4) and the sixth lower dielectric layer LD6 (or the first upper dielectric layer UD1) (and the third, fourth and sixth upper dielectric layers UD3, UD4 and UD6), all of which are of the first dielectric material, can be performed, without etch selectivity to reach the lower and upper sacrificial layers LS and US. With the lower and upper sacrificial layers LS and US accessible, isotropic etching or wet etching can be performed to remove the lower and upper sacrificial layers LS and US. Etchant exposure time may be controlled to avoid undesirable over etching.

As shown in FIGS. 11, 11A and 11B, spaces formed due to the removal of the first lower dielectric layer LD1 (and the third and fourth lower dielectric layers LD3 and LD4), the sixth lower dielectric layer LD6 (or the first upper dielectric layer UD1) (and the third, fourth and sixth upper dielectric layers UD3, UD4 and UD6), and the lower and upper sacrificial layers LS and US can be filled with a dielectric material, e.g., the fifth dielectric material 450, followed by CMP. The substrate 110 can then be removed.

Alternatively, the spaces can be partially filled with a dielectric material. For example, only the spaces that are formed due to the directional etching of all layers of the layer stack 120 can be filled with the fifth dielectric material 450, e.g., by chemical vapor deposition (CVD), with the spaces that are formed due to the removal of the first lower dielectric layer LD1 (and the third and fourth lower dielectric layers LD3 and LD4), the sixth lower dielectric layer LD6 (or the first upper dielectric layer UD1) (and the third, fourth and sixth upper dielectric layers UD3, UD4 and UD6), and the lower and upper sacrificial layers LS and US being air gaps, which provide highest insulation.

Figure 12:
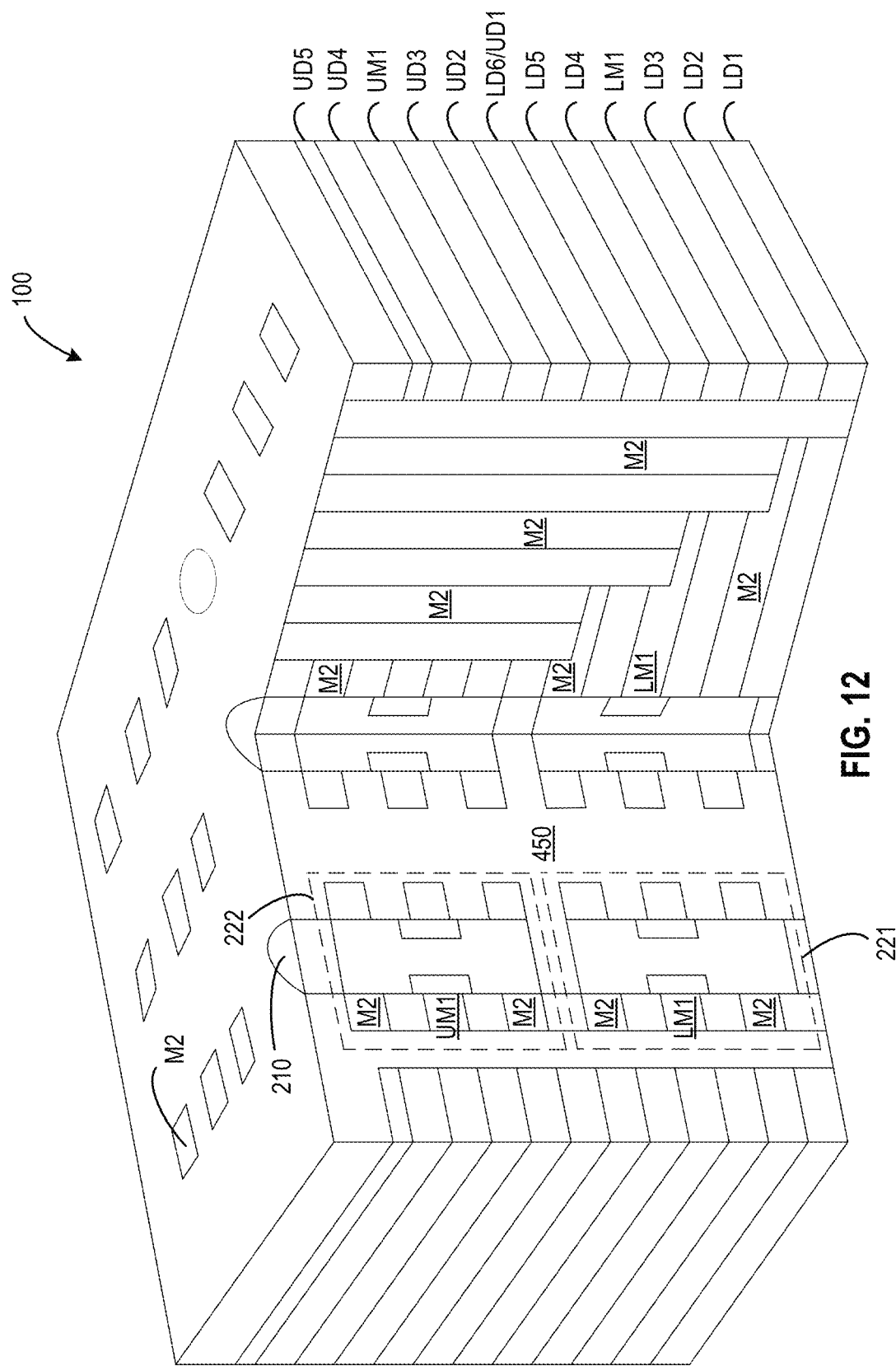
FIG. 12 shows a schematic diagram of the first semiconductor structure of FIGS. 11, 11A and 11B.

FIG. 12 shows a schematic diagram of the first semiconductor structure 100 of FIGS. 11, 11A and 11B. As shown, the first semiconductor structure 100 can include multiple separated and insulated vertical channel structures (e.g., three vertical channel structures), each of which can include at least a lower vertical channel structure and an upper vertical channel structure, e.g., the lower and upper vertical channel structures 221 and 222, that are separated from each other by a dielectric material, e.g., the fifth dielectric material 450.

Figure 13:
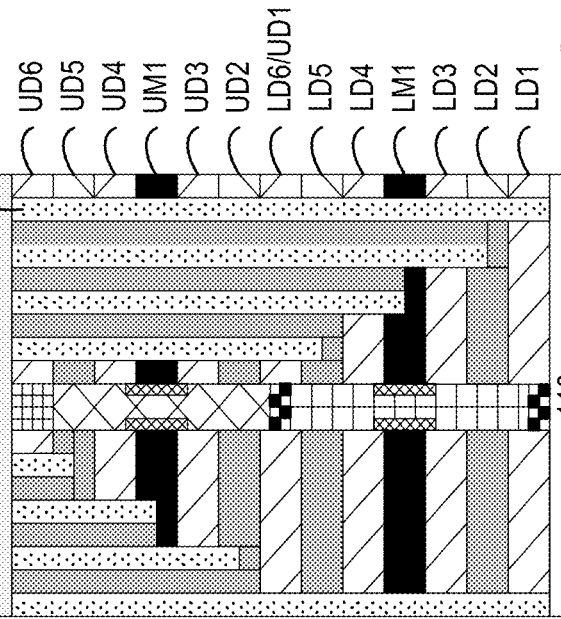
Figure 13A:
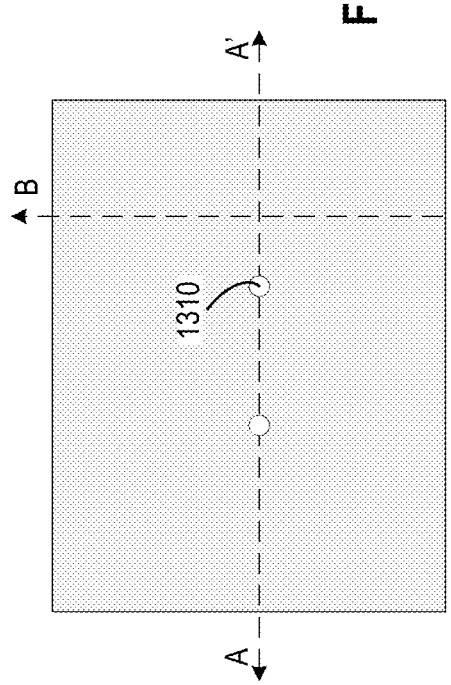
Figure 13B:
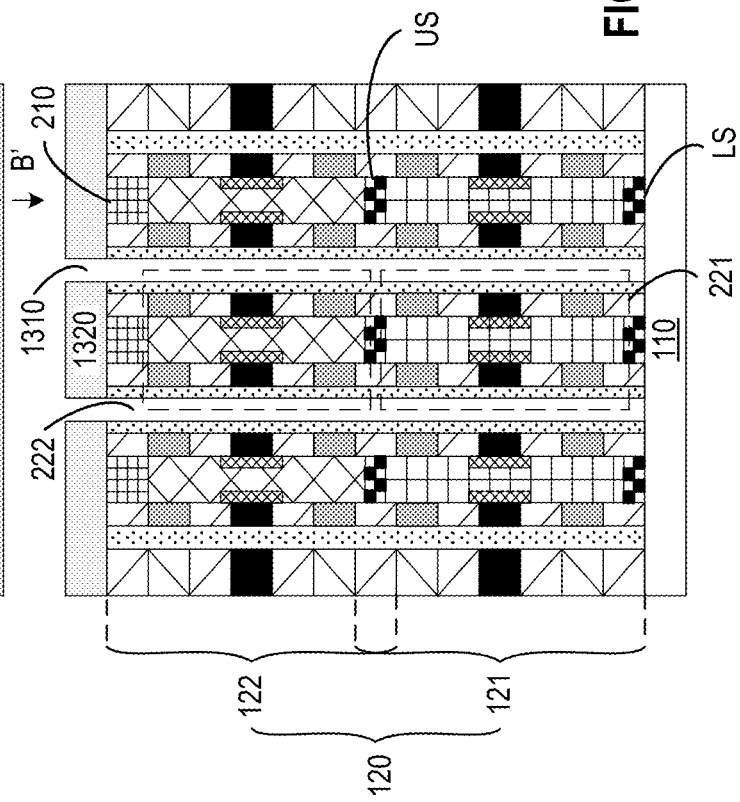

FIGS. 13-16 are top views illustrating a second exemplary method for forming a second semiconductor structure 1300 according to some embodiments of the present disclosure. FIGS. 13A-16A are cross-sectional views of the second semiconductor structure 1300 along lines AA' of FIGS. 13-16, respectively. FIGS. 13B-16B are cross-sectional views of the second semiconductor structure 1300 along lines BB' of FIGS. 13-16, respectively. The second exemplary method differs from the first exemplary method in that in the second exemplary method a hard mask can be deposited prior to formation of the trenches (or shafts or openings) to protect the second metal layer M2, which will become exposed after wet etching is performed, as shown in FIGS. 10, 10A and 10B. As shown in FIGS. 13, 13A and 13B, a hard mask 1320 (or a dielectric layer of a fourth dielectric material) can be deposited on the second semiconductor structure 1300. An etch mask can then be formed to etch a trench (or shaft or opening) 1310 through the hard mask 1320 at a junction point of two consecutive semiconductor devices, and directional etching of all layers of the layer stack 120 can be performed to uncover the substrate 110. In an embodiment, the trenches 1310 can enable access to remove the first lower dielectric layer LD1 and the sixth lower dielectric layer LD6 (or the first upper dielectric layer UD1) to uncover the lower sacrificial layer LS and the upper sacrificial layer US, respectively. The hard mask 1320 can then be stripped.

As shown in FIGS. 14, 14A and 14B, wet etching of the first lower dielectric layer LD1 (and the third and fourth lower dielectric layers LD3 and LD4) and the sixth lower dielectric layer LD6 (or the first upper dielectric layer UD1) (and the third, fourth and sixth upper dielectric layers UD3, UD4 and UD6), all of which are of the first dielectric material, can be performed, without etch selectivity to reach the lower and upper sacrificial layers LS and US. With the lower and upper sacrificial layers LS and US accessible, isotropic etching or wet etching can be performed to remove the lower and upper sacrificial layers LS and US. As the top surface of the second semiconductor structure 1300 is protected by the hard mask 1320, only a portion of the second metal layer M2 can be seen in FIG. 14, which is different from FIG. 10.

Figure 15:
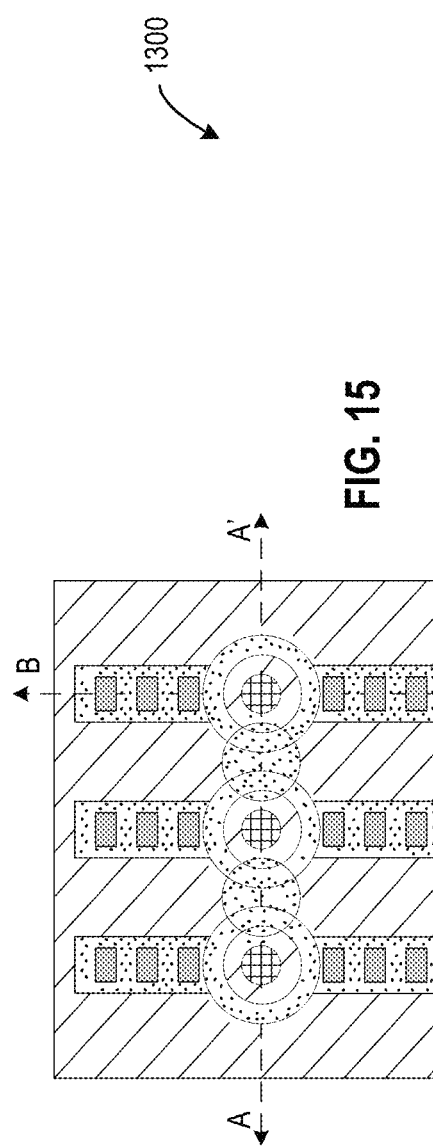
Figure 15B:
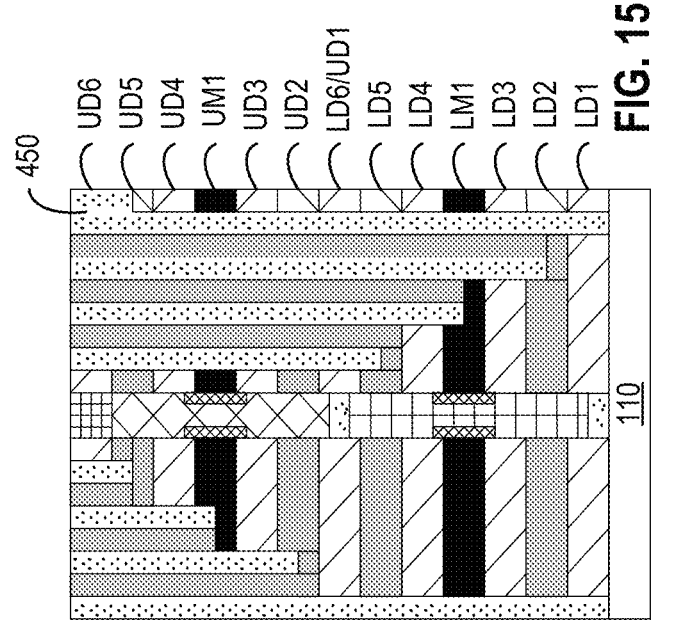
Figure 15A:
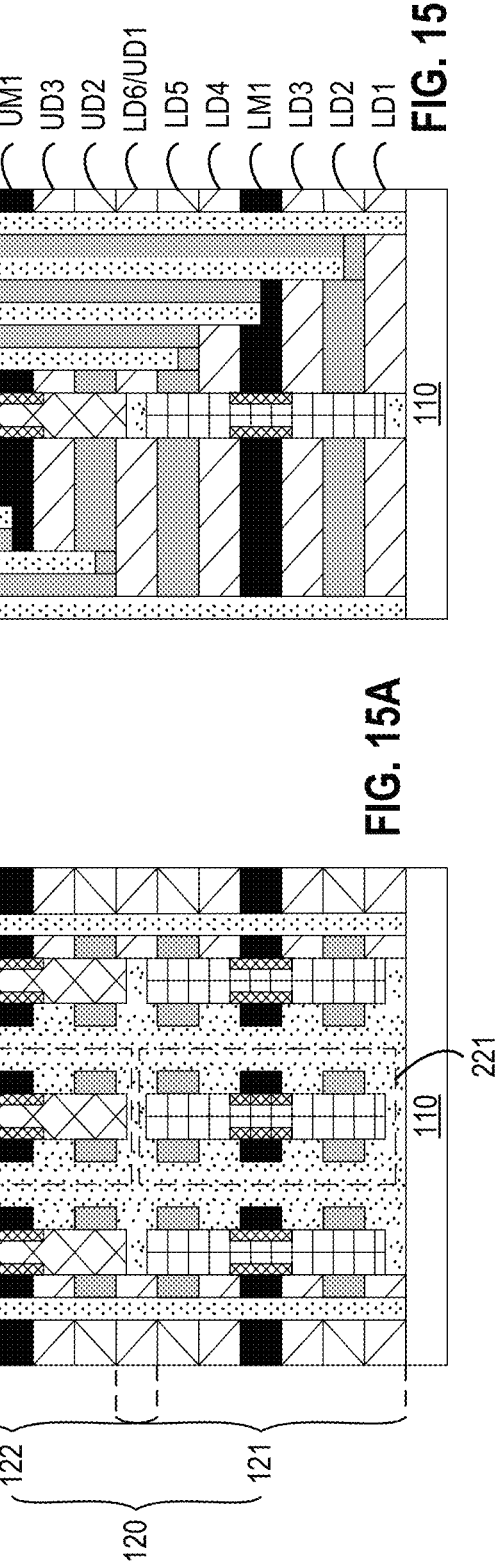

As shown in FIGS. 15, 15A and 15B, spaces formed due to the removal of the first lower dielectric layer LD1 (and the third and fourth lower dielectric layers LD3 and LD4), the sixth lower dielectric layer LD6 (or the first upper dielectric layer UD1) (and the third, fourth and sixth upper dielectric layers UD3, UD4 and UD6), and the lower and upper sacrificial layers LS and US can be filled with a dielectric material, e.g., the fifth dielectric material 450, followed by CMP. The substrate 110 can then be removed.

Alternatively, as shown in FIGS. 16, 16A and 16B, the spaces can be partially filled with a dielectric material. For example, only the spaces that are formed due to the directional etching of all layers of the layer stack 120 can be filled with the fifth dielectric material 450, e.g., by chemical phase deposition (CVD), with the spaces that are formed due to the removal of the first lower dielectric layer LD1 (and the third and fourth lower dielectric layers LD3 and LD4), the sixth lower dielectric layer LD6 (or the first upper dielectric layer UD1) (and the third, fourth and sixth upper dielectric layers UD3, UD4 and UD6), and the lower and upper sacrificial layers LS and US being air gaps, which provide highest insulation.

FIGS. 17 and 18 are top views illustrating a third exemplary method for forming a third semiconductor structure 1700 according to some embodiments of the present disclosure. FIGS. 17A and 18A are cross-sectional views of the third semiconductor structure 1700 along lines AA' of FIGS. 17 and 18, respectively. FIGS. 17B and 18B are cross-sectional views of the third semiconductor structure 1700 along lines BB' of FIGS. 17 and 18, respectively. The third exemplary method differs from the first exemplary method in that in the third exemplary method the first lower dielectric layer LD1 and the sixth lower dielectric layer LD6 (or the first upper dielectric layer UD1) of the layer stack 120 of the first semiconductor structure 100 can be replaced with a first lower dielectric layer LD19 and a sixth lower dielectric layer LD69 (or a first upper dielectric layer UD19) of a layer stack 1720 of the third semiconductor structure 1700, all of which are of a ninth dielectric material that is etched selectively with respect to the first dielectric material, as shown in FIGS. 17, 17A and 17B. This can enable opening access to the lower and upper sacrificial layers LS and US without having to remove the third and fourth lower dielectric layers LD2 and LD4 and the third and fourth upper dielectric layers UD2 and UD4, which are of the first dielectric material.

As shown in FIGS. 18, 18A and 18B, after the steps described in FIGS. 2-9 are performed, only the first lower dielectric layer LD19 and the sixth lower dielectric layer LD69/first upper dielectric layer UD19 need to be etched (via wet etching or vapor phase etching, for example), without having to etch the third and fourth lower dielectric layers LD2 and LD4 and the third and fourth upper dielectric layers UD2 and UD4. Then the lower and upper sacrificial layers LS and US can be etched and removed to formed spaces, and the spaces can be filled with, a dielectric material, e.g., the fifth dielectric material 450, followed by CMP. Alternatively, the spaces can also be partially filled with a dielectric material. For example, only the spaces that are formed due to the directional etching of all layers of the layer stack 120 can be filled with the fifth dielectric material 450, with the spaces that are formed due to the removal of the lower and upper sacrificial layers LS and US being air gaps.

FIGS. 19 and 20 are top views illustrating a fourth exemplary method for forming a fourth semiconductor structure 1900 according to some embodiments of the present disclosure. FIGS. 19A and 20A are cross-sectional views of the fourth semiconductor structure 1900 along lines AA' of FIGS. 19 and 20, respectively. FIGS. 19B and 20B are cross-sectional views of the fourth semiconductor structure 1900 along lines BB' of FIGS. 19 and 20, respectively. The fourth exemplary method differs from the third exemplary method in that the fourth exemplary method can form a trench (or shaft or opening) at the side of the vertically deposited second metal layer M2, instead of forming a round trench at a junction point of two consecutive semiconductor devices. For example, an etch mask can be formed to etch a trench (or shaft or opening) 1910 at the side of the vertically deposited second metal layer M2 to the sixth lower dielectric layer LD69 (or the first upper dielectric layer UD19), and directional etching of the fifth dielectric material 450 can be performed to uncover the substrate 110. In an embodiment, the trenches 1910 can enable access to remove the first lower dielectric layer LD19 and the sixth lower dielectric layer LD69 (or the first upper dielectric layer UD19), which are of the ninth dielectric material, to uncover the lower sacrificial layer LS and the upper sacrificial layer US, respectively. The etch mask can then be stripped.

As shown in FIGS. 20, 20A and 20B, wet etching can be performed on the first lower dielectric layer LD19 and the sixth lower dielectric layer LD69 (or the first upper dielectric layer UD19) to get access to the lower sacrificial layer LS and the upper sacrificial layer US and then performed on the lower sacrificial layer LS and the upper sacrificial layer US, to form spaces, and the spaces can be filled with, a dielectric material, e.g., the fifth dielectric material 450, followed by CMP. This example step can be used for side-by-side semiconductor devices together. In this etching step, all top layers have good support from other layers to maintain the robustness of the vertical channel structures. Alternatively, the spaces can also be partially filled with a dielectric material. For example, only the spaces that are formed due to the directional etching of all layers of the layer stack 120 can be filled with the fifth dielectric material 450, with the spaces that are formed due to the removal of the lower and upper sacrificial layers LS and US being air gaps.

Figure 21:
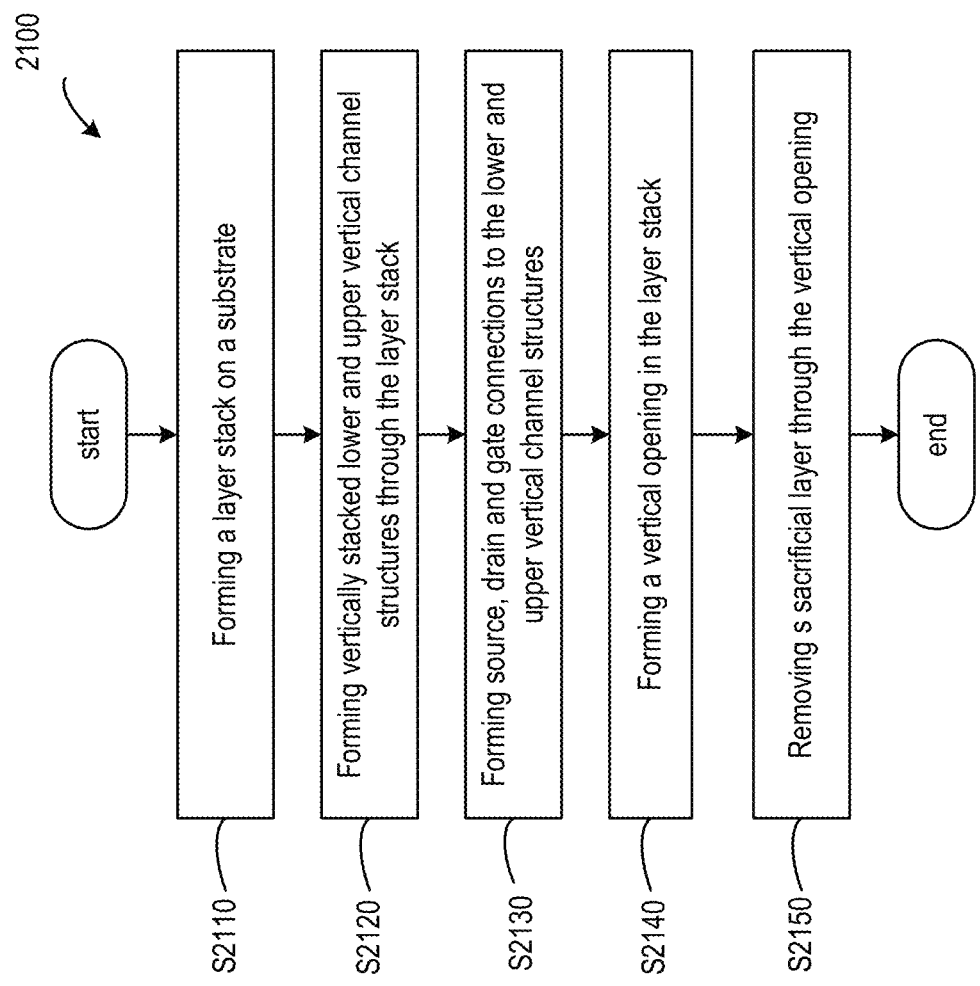
FIG. 21 is a flow chart illustrating a fifth exemplary method for forming a fifth semiconductor structure according to some embodiments of the present disclosure.

FIG. 21 is a flow chart illustrating a fifth exemplary method 2100 for forming a semiconductor structure according to some embodiments of the present disclosure. In an embodiment, some of the steps of the fifth exemplary method 2100 shown can be performed concurrently or in a different order than shown, can be substituted by other method steps, or can be omitted. Additional method steps can also be performed as desired. In another embodiment, the fifth exemplary method 2100 can correspond to the first to fourth exemplary methods shown in FIGS. 1-20, 1A-11A, 13A-20A, 1B-11B and 13B-20B.

At step S2110, a layer stack can be formed on a substrate, the layer stack including alternating metal layers and dielectric layers. For example, the layer stack 120/1720 can be formed on the substrate 110, as shown in FIGS. 1A, 1B, 17A and 17B.

At step S2120, vertically stacked lower and upper vertical channel structures can be formed that vertically extend through the layer stack, the lower and upper vertical channel structures being separated by a sacrificial layer. For example, the lower and upper vertical channel structures 221 and 222 can be formed that vertically extend through the layer stack 120/1720 and the lower and upper vertical channel structures 221 and 222 are separated by the upper sacrificial layer US, as shown in FIGS. 2A, 2B, 13A, 13B, 18A, 18B, 19A and 19B.

At step S2130, source, drain and gate connections to the lower and upper vertical channel structures can be formed, the source, drain and gate connections extending horizontally from the lower and upper vertical channel structures and then vertically to a location above the upper vertical channel structure. For example, the second metal layer M2 can be formed by extending horizontally from the lower and upper vertical channel structures 221 and 222 and then vertically to a location above the upper vertical channel structure 222, as shown in FIGS. 8B, 13B, 18B and 19B.

At step S2140, a vertical opening can be formed in the layer stack. For example, the opening 910/1310 can be formed in the layer stack 120, as shown in FIG. 9A and FIG. 13A, and the opening 1910 can be formed in the layer stack 1720, as shown in FIG. 19A.

At step S2150, the sacrificial layer can be removed through the vertical opening to separate the lower and upper vertical channel structures. For example, the sacrificial layer US can be removed through the opening 910/1310, as shown in FIGS. 10A and 14A, and the sacrificial layer US can be removed through the opening 1910, as shown in FIG. 19A.

FIG. 22 is a flow chart illustrating a sixth exemplary method 2200 for forming a semiconductor structure according to some embodiments of the present disclosure. In an embodiment, some of the steps of the sixth exemplary method 2200 shown can be performed concurrently or in a different order than shown, can be substituted by other method steps, or can be omitted. Additional method steps can also be performed as desired. In another embodiment, the sixth exemplary method 2200 can correspond to the first to fourth exemplary methods shown in FIGS. 1-20, 1A-11A, 13A-20A, 1B-11B and 13B-20B.

At step S2210, a layer stack can be formed on a substrate, the layer stack including alternating metal layers and dielectric layers. For example, the layer stack 120/1720 can be formed on the substrate 110, as shown in FIGS. 1A, 1B, 17A and 17B.

At step S2220, a vertical channel structure can be formed that vertically extends through the layer stack, the vertical channel structures being separated from the substrate by a sacrificial layer. For example, the vertical channel structure 221 can be formed that vertically extend through the layer stack 120/1720 and separated from the substrate 110 by the lower sacrificial layer LS, as shown in FIGS. 2A, 2B, 13A, 13B, 18A, 18B, 19A and 19B.

At step S2230, source, drain and gate connections to the vertical channel structure can be formed, the source, drain and gate connections extending horizontally from the vertical channel structure and then vertically to a location above the vertical channel structure. For example, the second metal layer M2 can be formed by extending horizontally from the lower vertical channel structure 221 and then vertically to a location above the lower vertical channel structure 221, as shown in FIGS. 8B, 13B, 18B and 19B.

At step S2240, a vertical opening can be formed in the layer stack. For example, the opening 910/1310 can be formed in the layer stack 120, as shown in FIG. 9A and FIG. 13A, and the opening 1910 can be formed in the layer stack 1720, as shown in FIG. 19A.

At step S2250, the sacrificial layer can be removed through the vertical opening to separate the vertical channel structure from the substrate. For example, the sacrificial layer LS can be removed through the opening 910/1310, as shown in FIGS. 10A and 14A, and the sacrificial layer LS can be removed through the opening 1910, as shown in FIG. 19A.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of embodiments of the disclosure are not intended to be limiting. Rather, any limitations to embodiments of the disclosure are presented in the following claims.

What is claimed is:

1. A method, comprising:
    forming a layer stack on a substrate, the layer stack including alternating metal layers and dielectric layers;
    forming vertically stacked lower and upper vertical channel structures that vertically extend through the layer stack, the lower and upper vertical channel structures being separated by a sacrificial layer;
    forming source, drain and gate connections to the lower and upper vertical channel structures, the source, drain and gate connections extending horizontally from the lower and upper vertical channel structures and then vertically to a location above the upper vertical channel structure;
    forming a vertical opening in the layer stack; and
    removing the sacrificial layer through the vertical opening to separate the lower and upper vertical channel structures.

2. The method of claim 1, wherein the lower and upper vertical channel structures are epitaxially grown on the substrate.

3. The method of claim 1, wherein the sacrificial layer is of a sacrificial epitaxial material and is epitaxially grown from the lower vertical channel structure.

4. The method of claim 1, wherein the sacrificial layer is removed by isotropic etching.

5. The method of claim 1, wherein the sacrificial layer is removed by wet etching.

6. The method of claim 1, wherein removing the sacrificial layer includes removing a portion of one of the dielectric layers between the vertical opening and the sacrificial layer for accessing the sacrificial layer.

7. The method of claim 1, further comprising filling the vertical opening such that an air gap remains as an isolation between the lower and upper vertical channel structures.

8. The method of claim 1, further comprising filling the vertical opening such that an air gap between the lower and upper vertical channel structures is filled with a dielectric material.

9. The method of claim 1, wherein forming vertically stacked lower and upper vertical channel structures includes forming two vertically stacked lower and upper vertical channel structures, and the vertical opening is formed between the two vertically stacked lower and upper vertical channel structures.

10. The method of claim 1, wherein the vertical opening is formed by the location where the source, drain and gate connections extend vertically above the upper vertical channel structure.

11. The method of claim 1, wherein one of the dielectric layers of the layer stack located for removing the sacrificial layer has an etch selectivity different from other dielectric layers of the layer stack.

12. The method of claim 1, wherein the metal layers of the layer stack include the source, drain and gate connections extending horizontally from the lower and upper vertical channel structures.

13. The method of claim 1, wherein some of the dielectric layers of the layer stack are located correspondingly to the source, drain and gate connections extending horizontally from the lower and upper vertical channel structures, and the method further comprising:
replacing the some of the dielectric layers with another metal layer as the source, drain and gate connections extending horizontally from the lower and upper vertical channel structures.

14. The method of claim 1, wherein the lower and upper vertical channel structures are separated from the substrate by another sacrificial layer, and removing the sacrificial layer through the vertical opening includes removing the sacrificial layer and the another sacrificial layer through the vertical opening.

15. A method, comprising:
forming a layer stack on a substrate, the layer stack including alternating metal layers and dielectric layers;
forming a vertical channel structure that vertically extends through the layer stack, the vertical channel structure being separated from the substrate by a sacrificial layer;
forming source, drain and gate connections to the vertical channel structure, the source, drain and gate connections extending horizontally from the vertical channel structure and then vertically to a location above the vertical channel structure;
forming a vertical opening in the layer stack; and
removing the sacrificial layer through the vertical opening to separate the vertical channel structure from the substrate.

16. The method of claim 15, wherein forming a vertical channel structure includes forming vertically stacked lower and upper vertical channel structures, the lower and upper vertical channel structures being separated by another sacrificial layer, and removing the sacrificial layer through the vertical opening includes removing the sacrificial layer and the another sacrificial layer through the vertical opening.

17. The method of claim 15, further comprising filling the vertical opening such that an air gap remains as an isolation between the vertical channel structure and the substrate.

18. The method of claim 15, further comprising filling the vertical opening such that an air gap between the vertical channel structure and the substrate is filled with a dielectric material.

19. The method of claim 15, wherein forming a vertical channel structure includes forming two side-by-side vertical channel structures, and the vertical opening is formed between the two vertical channel structures.

20. The method of claim 15, wherein the vertical opening is formed by the location where the source, drain and gate connections extend vertically above the vertical channel structure.

* * * * *